United States Patent
Wopat et al.

(10) Patent No.: US 11,837,937 B2
(45) Date of Patent: Dec. 5, 2023

(54) HAPTIC ACTUATOR INCLUDING FIELD MEMBER WITHIN SLOTTED OPENING OF SUSPENDED COIL AND RELATED METHODS

(71) Applicant: Apple Inc., Cupertino, CA (US)

(72) Inventors: Kathryn K. Wopat, San Francisco, CA (US); Fu-Ying Huang, San Jose, CA (US); Hari Vasudevan, Bangalore (IN); Xin Alice Wu, Foster City, CA (US); Shingo Yoneoka, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 506 days.

(21) Appl. No.: 16/989,559

(22) Filed: Aug. 10, 2020

(65) Prior Publication Data

US 2021/0067022 A1 Mar. 4, 2021

Related U.S. Application Data

(60) Provisional application No. 62/893,961, filed on Aug. 30, 2019.

(51) Int. Cl.
| | |
|---|---|
| *H02K 33/18* | (2006.01) |
| *H05K 5/02* | (2006.01) |
| *B06B 1/04* | (2006.01) |

(52) U.S. Cl.
CPC ............. *H02K 33/18* (2013.01); *B06B 1/045* (2013.01); *H05K 5/0217* (2013.01)

(58) Field of Classification Search
CPC ............ B06B 1/04; B06B 1/045; H02K 33/00–33/18
See application file for complete search history.

(56) References Cited

U.S. PATENT DOCUMENTS

| | | | |
|---|---|---|---|
| 7,058,195 B2 * | 6/2006 | Trandafir | H02K 41/0356 |
| | | | 381/409 |
| 8,169,402 B2 | 5/2012 | Shahoian et al. | |
| 2014/0197936 A1 | 7/2014 | Biggs et al. | |
| 2015/0109223 A1 | 4/2015 | Kessler et al. | |
| 2015/0116205 A1 | 4/2015 | Westerman et al. | |
| 2015/0130730 A1 | 5/2015 | Harley et al. | |
| 2017/0085165 A1 * | 3/2017 | Hajati | H04M 19/047 |

FOREIGN PATENT DOCUMENTS

| | | |
|---|---|---|
| WO | 2013169299 A1 | 11/2013 |
| WO | 2013169303 A1 | 11/2013 |
| WO | 2013169305 A1 | 11/2013 |
| WO | 2013170099 A1 | 11/2013 |
| WO | 2013188307 A2 | 12/2013 |
| WO | 2014018111 A1 | 1/2014 |
| WO | 2015020663 A1 | 2/2015 |

OTHER PUBLICATIONS

Product Specification Sheet: GEEPLUS, VIBRO1 Vibration Actuator, 2 pages, www.geeplus.biz, downloaded on Jul. 15, 2015.

\* cited by examiner

*Primary Examiner* — Ramon M Barrera
(74) *Attorney, Agent, or Firm* — Brownstein Hyatt Farber Schreck, LLP

(57) ABSTRACT

A haptic actuator may include a base, a field member coupled to the base and that may include spaced apart permanent magnets. The haptic actuator may also include a coil having a loop shape defining a slotted opening therein, and a spring member suspending the coil so that the field member is within the slotted opening and permitting relative movement of the field member and the coil.

22 Claims, 24 Drawing Sheets

HAPTIC ACTUATOR INCLUDING FIELD MEMBER WITHIN SLOTTED OPENING OF SUSPENDED COIL AND RELATED METHODS

RELATED APPLICATIONS

The present application claims the priority benefit of provisional application Ser. No. 62/893,961 filed on Aug. 30, 2019, the entire contents of which are herein incorporated by reference.

TECHNICAL FIELD

The present disclosure relates to the field of electronics, and, more particularly, to the field of haptics.

BACKGROUND

Haptic technology is becoming a more popular way of conveying information to a user. Haptic technology, which may simply be referred to as haptics, is a tactile feedback based technology that stimulates a user's sense of touch by imparting relative amounts of force to the user.

A haptic device or haptic actuator is an example of a device that provides the tactile feedback to the user. In particular, the haptic device or actuator may apply relative amounts of force to a user through actuation of a mass that is part of the haptic device. Through various forms of tactile feedback, for example, generated relatively long and short bursts of force or vibrations, information may be conveyed to the user.

SUMMARY

A haptic actuator may include a base, and a field member coupled to the base and that may include a plurality of spaced apart permanent magnets. The haptic actuator may also include at least one coil having a loop shape defining a slotted opening therein, and a spring member suspending the at least one coil so that the field member is within the slotted opening and permitting relative movement of the field member and the at least one coil.

The plurality of spaced apart permanent magnets may include first and second sets of permanent magnets. The haptic actuator may also include a bearing coupled to the base between the first and second sets of permanent magnets, for example.

The haptic actuator may further a magnet spacer coupled between the field member and the base. The spring member may have a spring member opening therein sized to permit passage of the field member therethrough, for example.

The field member may include a ferritic body between the plurality of spaced apart permanent magnets, for example. The ferritic body may include stainless steel, for example.

The base may include stainless steel. The haptic actuator may also include a coil tray carrying the at least one coil and coupled to the base. The spring member may include ferritic material, for example.

The haptic actuator may further include at least one spacer carried by the spring member opposite the field member. The haptic actuator may also include a plurality of mechanical stops adjacent opposing ends of the field member, for example.

A method aspect is directed to a method of making a haptic actuator. The method may include coupling a field member to a base. The field member may include a plurality of spaced apart permanent magnets. The method may also include positioning a spring member to suspend at least one coil having a loop shape defining a slotted opening therein so that the field member is within the slotted opening and permits relative movement of the field member and the at least one coil.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation is used to indicate similar elements in alternative embodiments.

Figure 1:
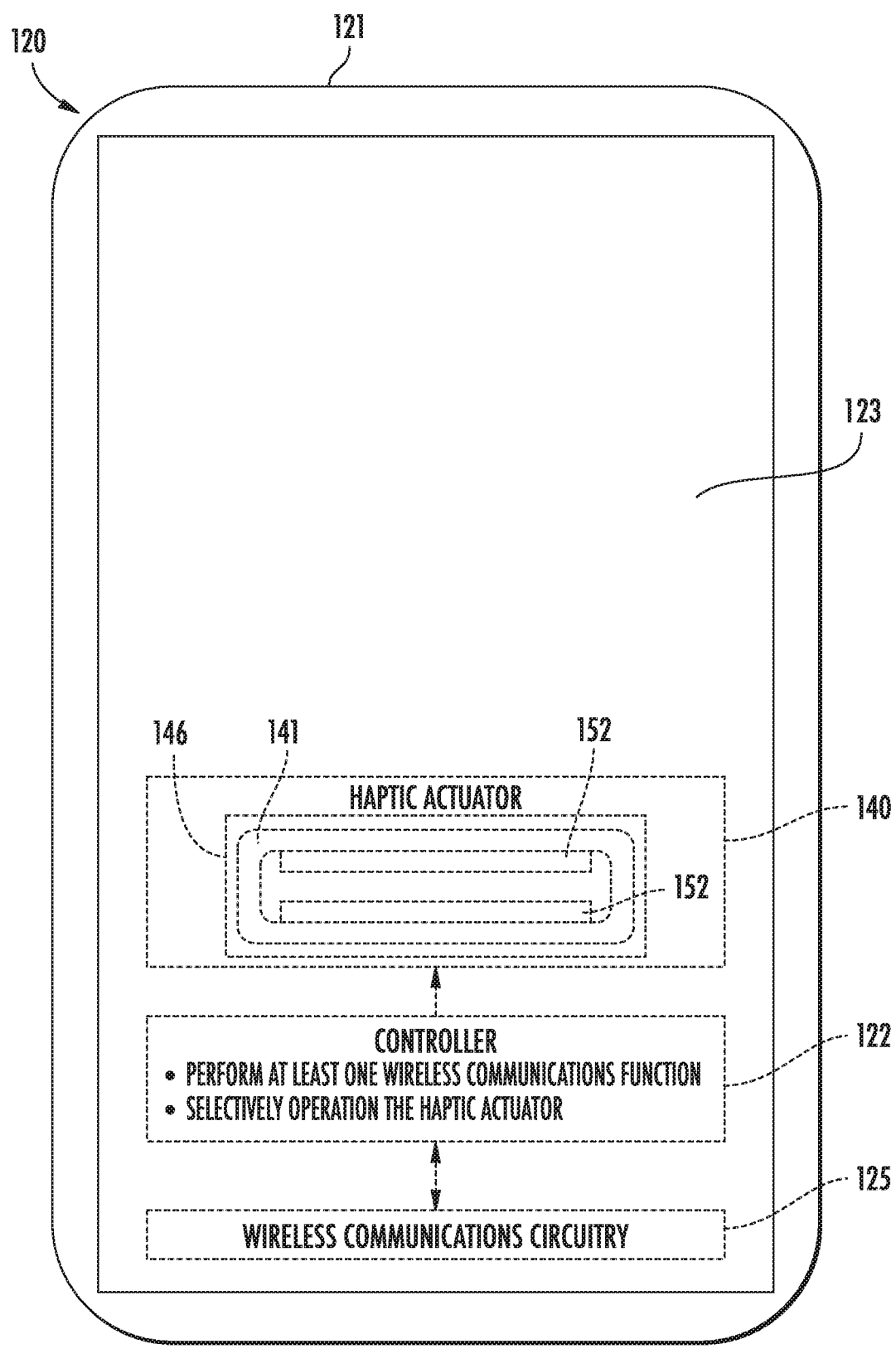
FIG. 1 is a schematic diagram of an electronic device in accordance with an embodiment.

Referring initially to FIG. 1, an electronic device 120 illustratively includes a device housing 121 and a controller 122 or processor carried by the device housing. The electronic device 120 is illustratively a mobile wireless communications device, for example, a cellular telephone or smartphone. The electronic device 120 may be another type of electronic device, for example, a wearable device (e.g., a watch), a tablet computer, a laptop computer, etc.

Wireless communications circuitry 125 (e.g. cellular, WLAN Bluetooth, etc.) is also carried within the device housing 121 and coupled to the controller 122. The wireless communications circuitry 125 cooperates with the controller 122 to perform at least one wireless communications function, for example, for voice and/or data. In some embodiments, the electronic device 120 may not include wireless communications circuitry 125.

A display 123 is also carried by the device housing 121 and is coupled to the controller 122. The display 123 may be, for example, a light emitting diode (LED) display, a liquid crystal display (LCD), or may be another type of display, as will be appreciated by those skilled in the art. The display 123 may be a touch display and may cooperate with the controller 122 to perform a device function in response to operation thereof. For example, a device function may include a powering on or off of the electronic device 120, initiating communication via the wireless communications circuitry 125, and/or performing a menu function.

The electronic device 120 illustratively includes a haptic actuator 140. The haptic actuator 140 is coupled to the controller 122 and provides haptic feedback to the user in the form of relatively long and short vibrations. The vibrations may be indicative of a message received, and the duration and type of the vibration may be indicative of the type of message received. Of course, the vibrations may be indicative of or convey other types of information. In some embodiments, the haptic actuator 140 may be implemented for use in a trackpad (e.g., in a laptop or portable computer) so that haptic feedback may be generated, for example, by displacing a surface associated with or coupled to the haptic actuator.

While a controller 122 is described, it should be understood that the controller may include one or more physical processors and/or other circuitry to perform the functions described herein.

Figure 2:
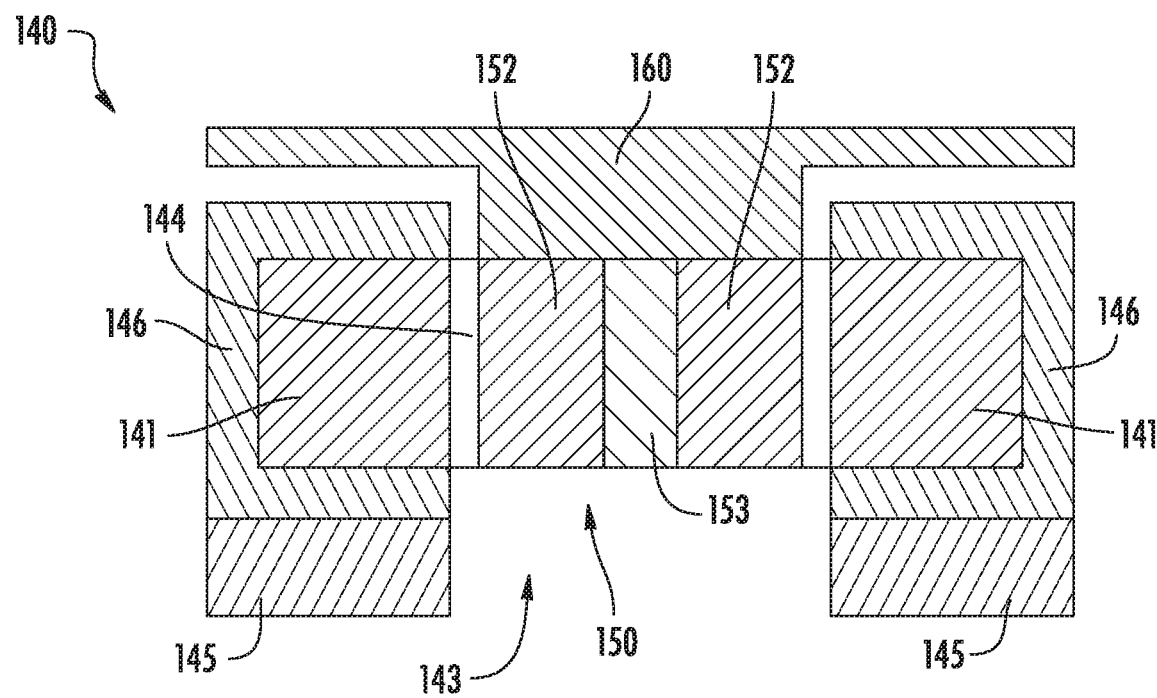
FIG. 2 is a schematic cross-sectional view of a haptic actuator in accordance with an embodiment.

Referring additionally to FIG. 2, the haptic actuator 140 includes a base 145, for example, a rigid base. The base 145 may be stainless steel. The base 145 may be or include other and/or additional materials, for example, non-ferritic materials.

The haptic actuator 140 also includes a coil 141 coupled to the base 145. The coil 141 illustratively has a loop shape that defines a slotted opening 144 therein. The coil 141 is illustratively carried by a coil tray 146. The coil tray 146 is coupled to the base 145. The coil tray 146 may include ferritic material, for example. There may be any number of coils 141.

The haptic actuator 140 also includes a field member 150 that includes spaced apart permanent magnets 152. While two permanent magnets 152 are illustrated, there may be any number of permanent magnets. The field member 150 also includes a ferritic body 153, for example, a stainless steel body, between the spaced apart permanent magnets 152. In some embodiments, the ferritic body 153 may include a non-magnetic material.

The haptic actuator 140 also includes a spring member 160 or cover spring, for example, that may include ferritic material. In some embodiments, the spring member 160 may include non-ferritic material. The spring member 160 suspends the field member 150 within the slotted opening 144 and permits relative movement of the field member and the coil 141.

As will be appreciated by those skilled in the art, the haptic actuator 140 defines a ferritic window 143 that allows larger movement of magnetic components and reduces magnetic attraction (closing) force between the permanent magnets 152 and rigid (ferritic) base 145.

Figure 3:
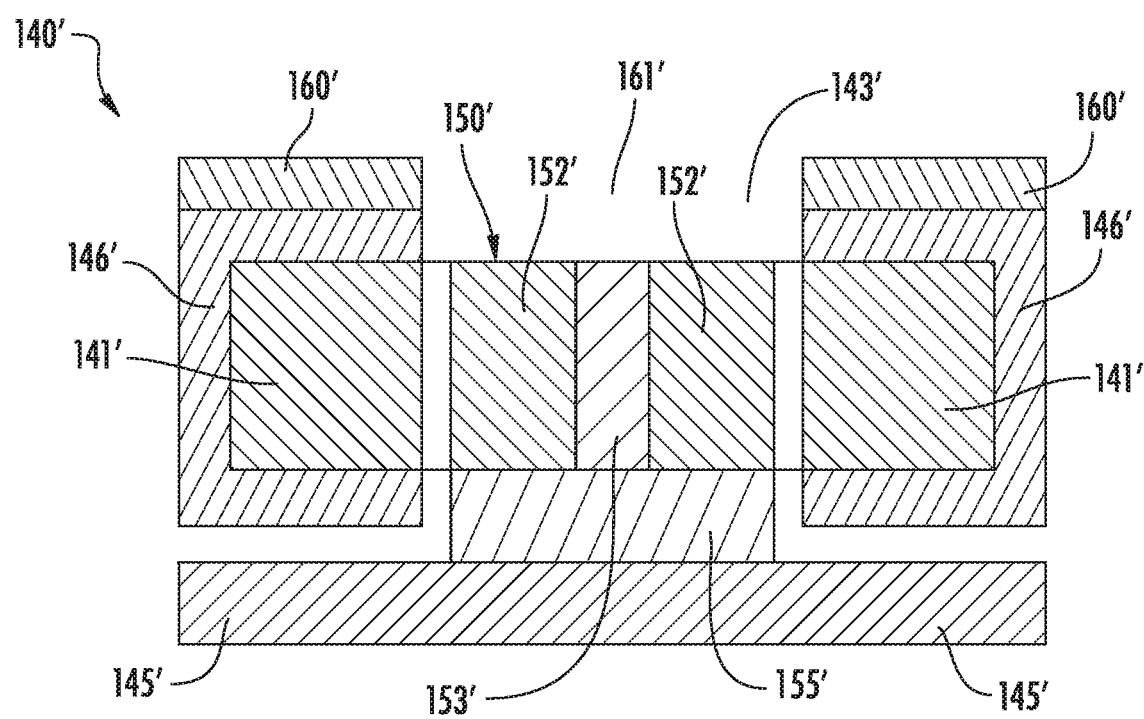
FIG. 3 is a schematic cross-sectional view of a haptic actuator in accordance with another embodiment.
Figure 4:
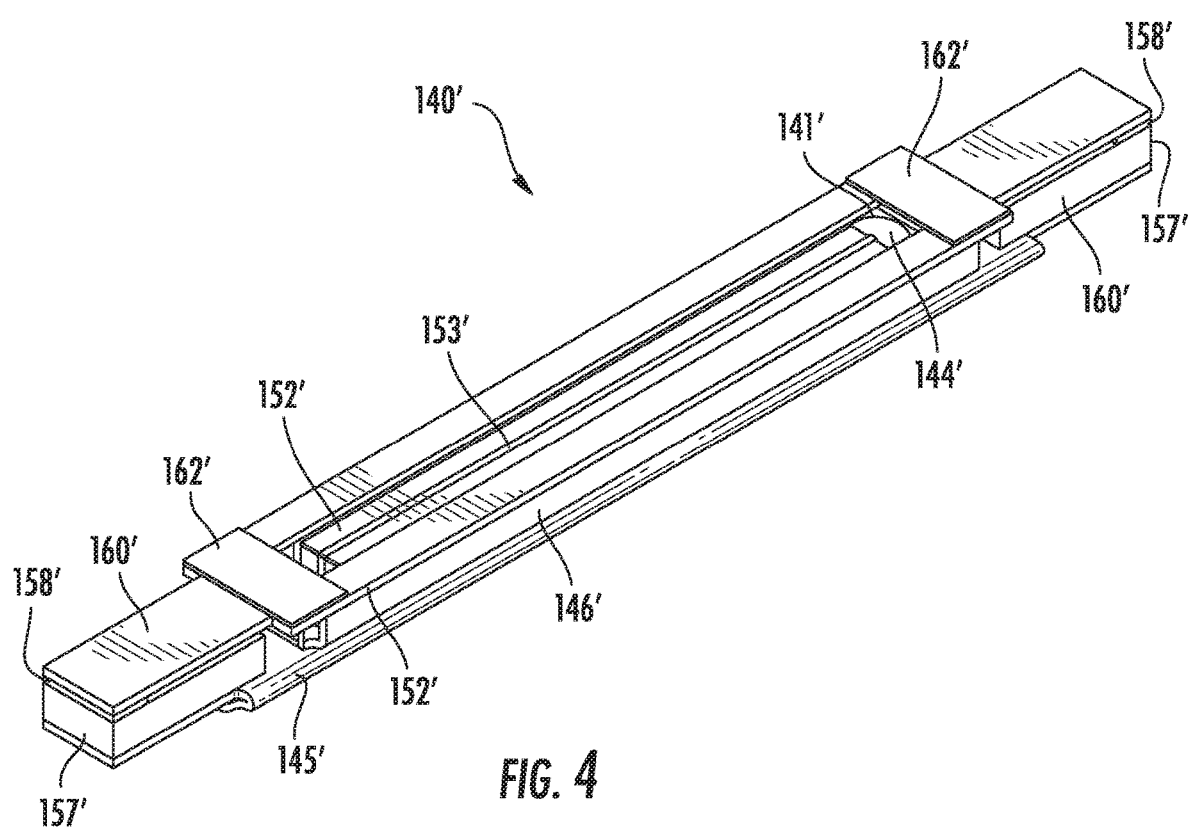
FIG. 4 is a perspective view of a haptic actuator in accordance with an embodiment.
Figure 5:
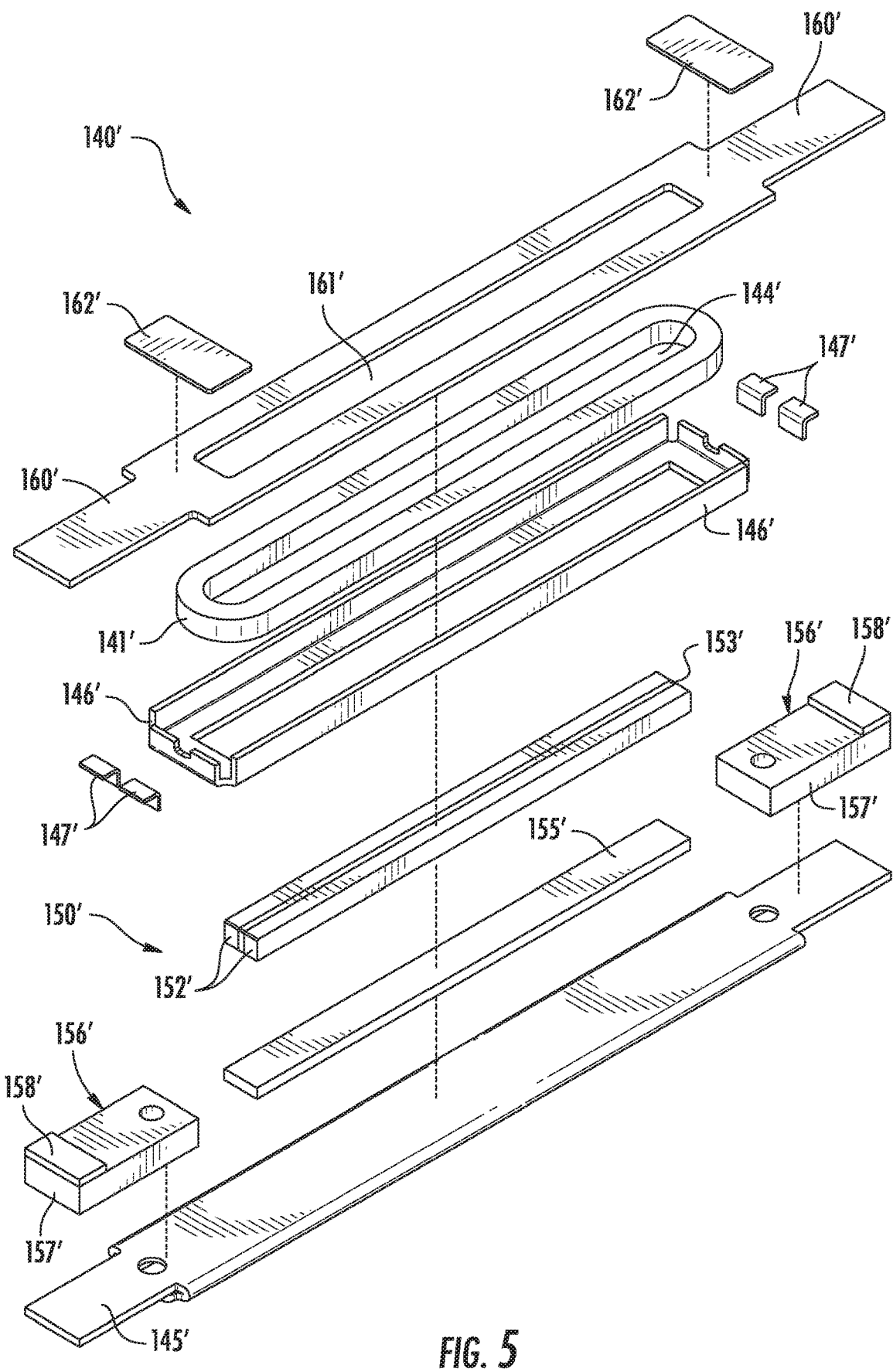
FIG. 5 is an exploded perspective view of a haptic actuator in accordance with an embodiment.

Referring now to FIGS. 3-5, in another embodiment, the haptic actuator 140' includes a base 145', for example, a rigid base. The base 145' may be stainless steel. The base 145' may be or include other and/or additional materials.

The haptic actuator 140' also includes a field member 150' coupled to the base 145' and that includes spaced apart permanent magnets 152'. While two permanent magnets 152' are illustrated, there may be any number of permanent magnets. The field member 150' also includes a ferritic body 153', for example, a stainless steel body, between the spaced apart permanent magnets 152'.

A magnet spacer 155' is coupled between the field member 150' and the base 145'. The magnet spacer 155' may be stainless steel, for example. Mechanical stops 156' are also carried by the base 145' adjacent opposing ends. The mechanical stops 156' each illustratively includes a fastener or screw boss 157' and a hard stop 158'. The mechanical stops 156' may be stainless steel.

The haptic actuator 140' also includes a coil 141' that illustratively has a loop shape that defines a slotted opening 144' therein. The coil 141' is illustratively carried by a coil tray 146'. The coil tray 146' is coupled to the base 145'. The coil tray 146' may include ferritic material, for example. There may be any number of coils 141'. Cover brackets 147' are optionally carried by or coupled to opposing ends of the coil tray 146'.

The haptic actuator 140' also includes a spring member 160' or cover spring, for example, that may include ferritic material. The spring member 160' suspends the coil 141' so that the field member 150' is within the slotted opening 144' and permits relative movement of the field member and the coil. The spring member 160' illustratively has a spring member opening 161' therein that is sized to permit passage of the field member 150' therein.

More particularly, the spring member 160' is coupled to the hard stops 158' which are coupled with the mechanical stops 156' and the base 145'. The hard stops 158' illustratively define a mechanical gap between the fastener or screw boss 157' and the spring member 160'. To achieve better alignment between the magnetic member or field member 150' and the center of the coil 141', the hard stops 158' may be of different thicknesses based on the dimensions of the field member and the coil.

The haptic actuator 140' may also include spacers 162' carried by the spring member 160' at an opposite side to the field member. The spacers 162' are carried at opposite ends of the spring member 160'. The spacers 162' transfer force generated by the haptic actuator 140' to, for example, the surface electronic device to which the haptic actuator is coupled. For example, when used in conjunction with a trackpad in a laptop or portable computer, the spacers 162' generate out-of-plane motion of the trackpad.

As will be appreciated by those skilled in the art, the haptic actuator 140' defines a ferritic window 143' that allows larger movement of magnetic components and reduces magnetic attraction (closing) force between the permanent magnets 152' and rigid (ferritic) base 145'.

Figure 6:
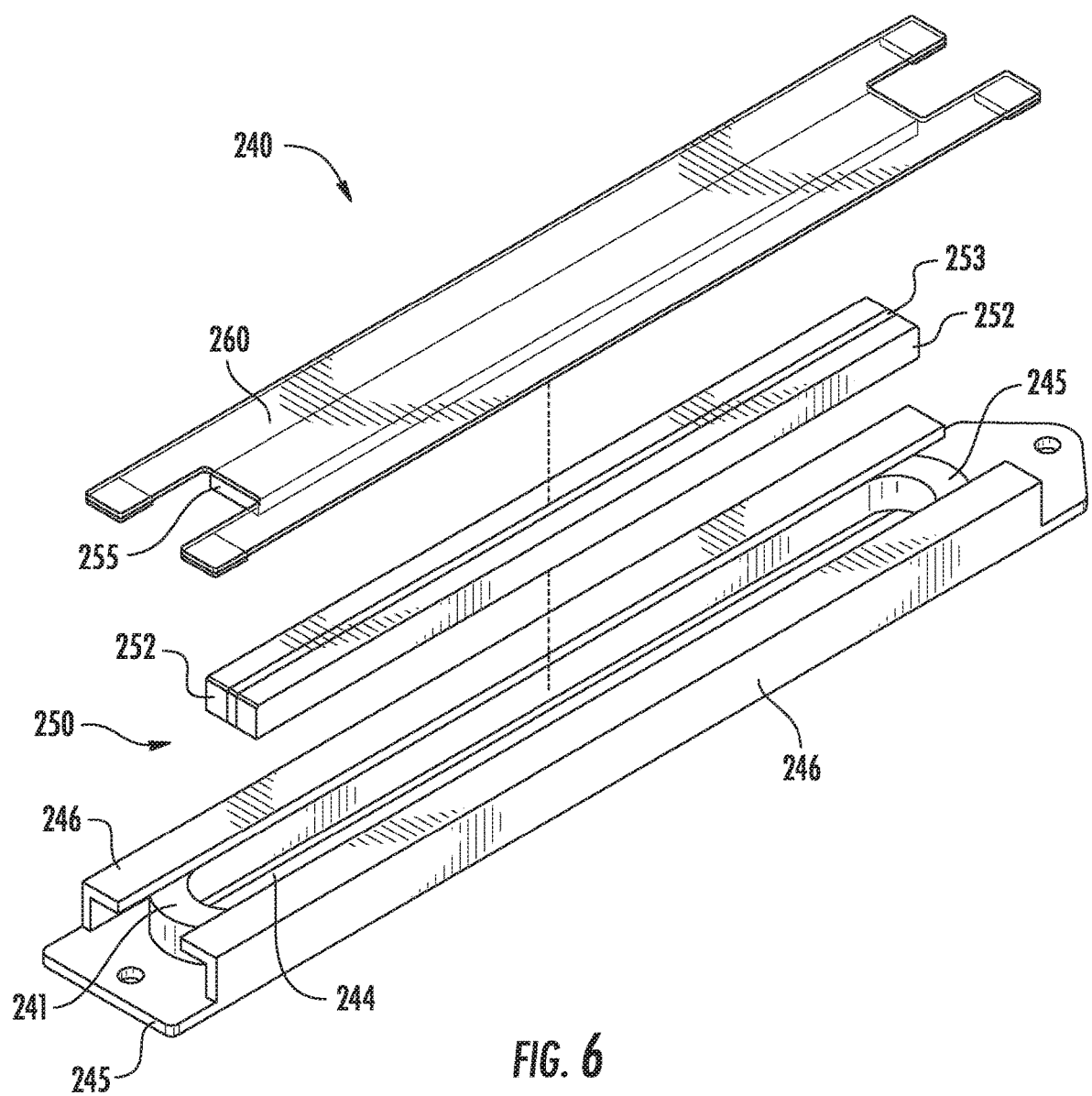
FIG. 6 is a partially exploded perspective view of a haptic actuator in accordance with another embodiment.

Referring now to FIG. 6, an embodiment of the haptic actuator 240 that constrains movement in the x, y, and z axes is illustrated. Illustratively, the coil tray 246 has an L-shape and is coupled to the base 245 to define a slot for the coil 241 to be received therein.

Similarly to the embodiments described above, the field member 250 includes spaced apart permanent magnets 252 that are movable relative to the coil 241 within the slotted opening 244. The field member 250 also includes a ferritic body 253 between the spaced apart permanent magnets 252. A magnet spacer 255 is coupled to the spring member 260 between the field member 250 and the spring member. The materials of the illustrated elements may be similar to the materials described above with respect to other embodiments. The illustrated embodiment may provide relatively higher spring stiffness in x-axis and y-axis directions relative to the z-axis direction. For example, the illustrated embodiment may provide a spring stiffness >250 N/mm in the x-axis direction and between 150 and 250 N/mm in the z-axis. Of course, other spring stiffness may be used.

Figure 7:
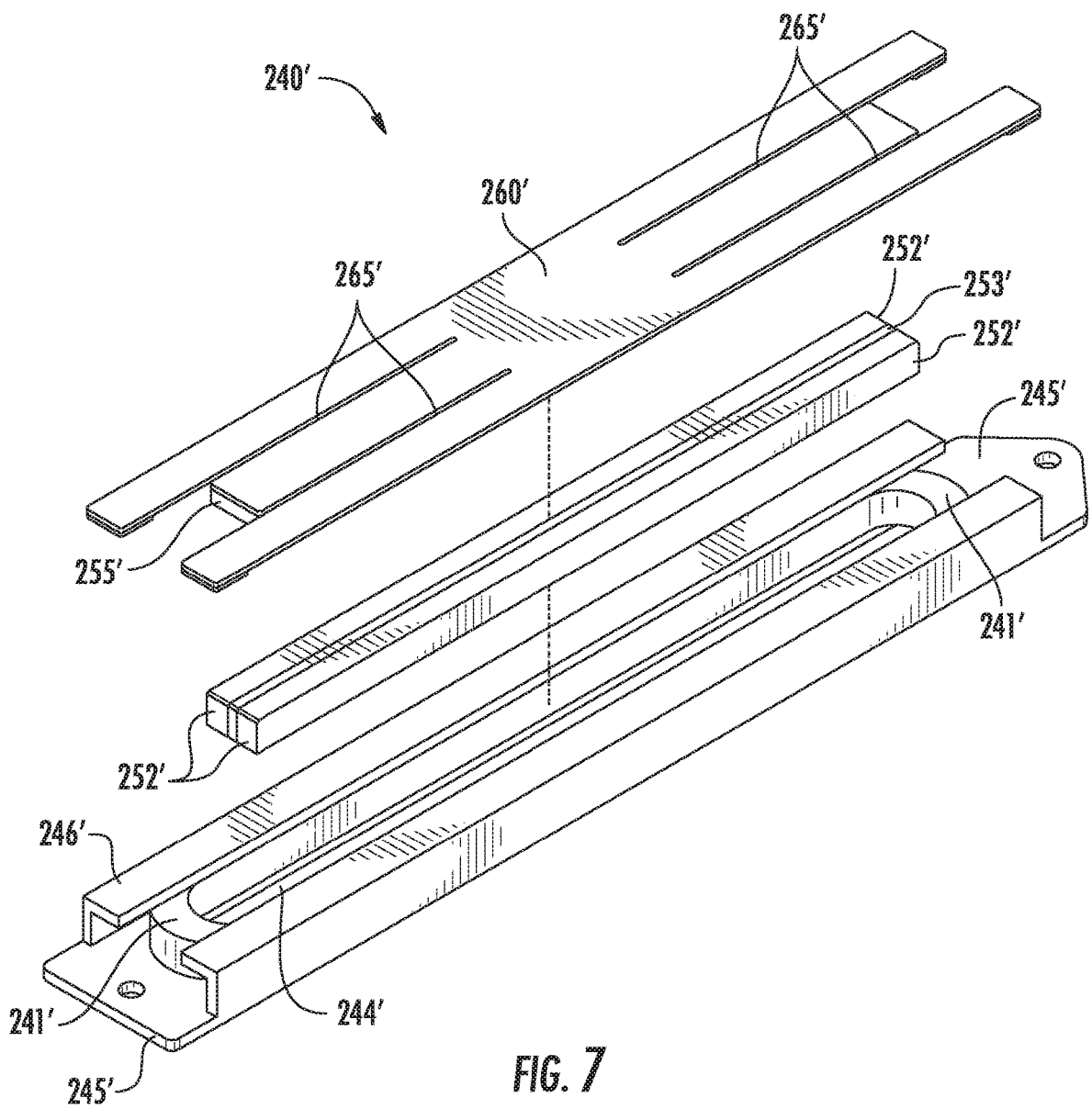
FIG. 7 is a partially exploded perspective view of a haptic actuator in accordance with another embodiment.

Referring now to FIG. 7, in another embodiment, movement may be constrained in the x and y axes. In the present embodiment, the cover layer 260' or spring member includes slits 265' extending from opposite ends of the cover layer and aligned with the magnet spacer 255'. The present embodiment may provide relatively higher spring stiffness in x-axis and y-axis directions relative to the z-axis direction. For example, the present embodiment may provide a spring stiffness >250 N/mm in the x-axis direction and there may be no stiffness in the z-axis direction. Of course, other spring stiffness may be used. Indeed, as will be appreciated by those skilled in the art, there may be no deformation during a bottom-out condition. Elements illustrated, but not specifically described are similar to the elements described above.

Figure 8:
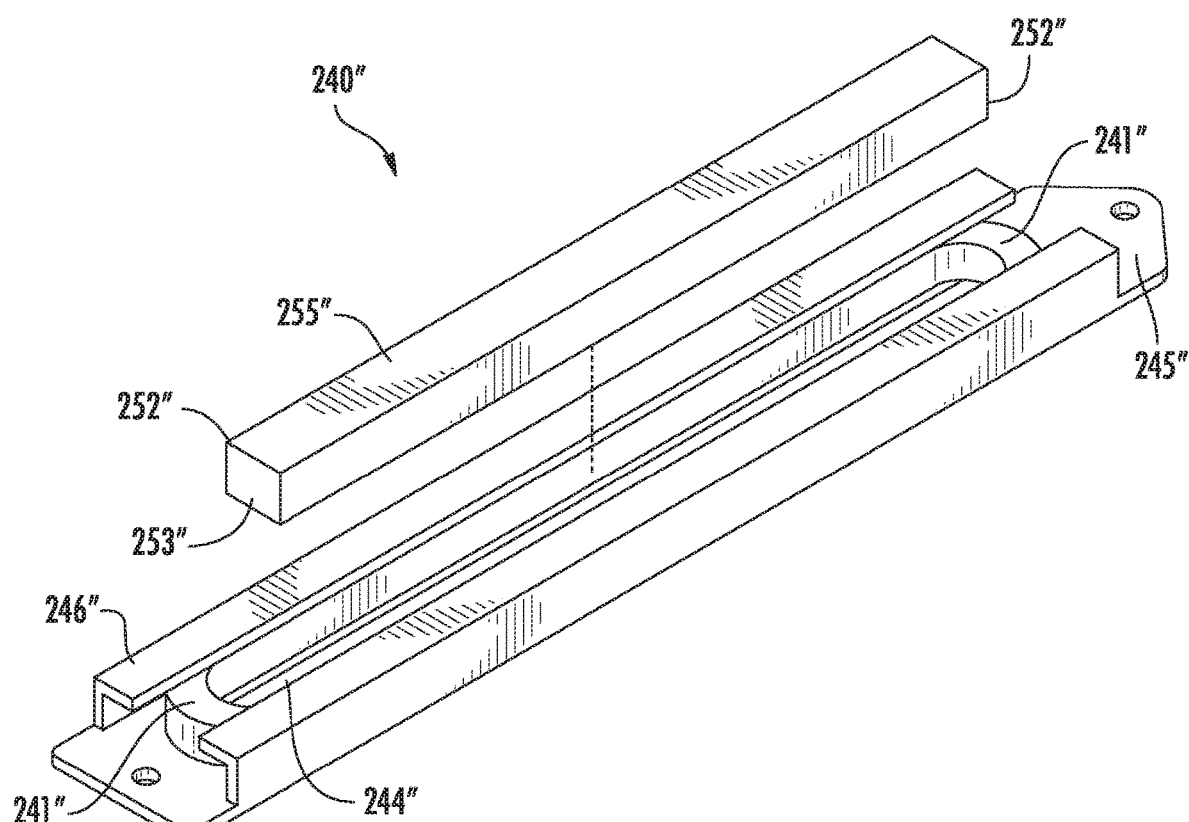
FIG. 8 is a partially exploded perspective view of a haptic actuator in accordance with another embodiment.

Referring now to FIG. 8, in another embodiment no spring member may be included. In the present embodiment, the base 245", coil 241", coil tray 246", permanent magnets 252", and ferritic body 253" are configured as described above with respect to FIGS. 8 and 9. In the present embodiment, the lack of a spring member may remove excess or redundant stiffness in the haptic actuator 240" and may allow for a greater mechanical control outline and permit more components (e.g., electromechanical).

Figure 9:
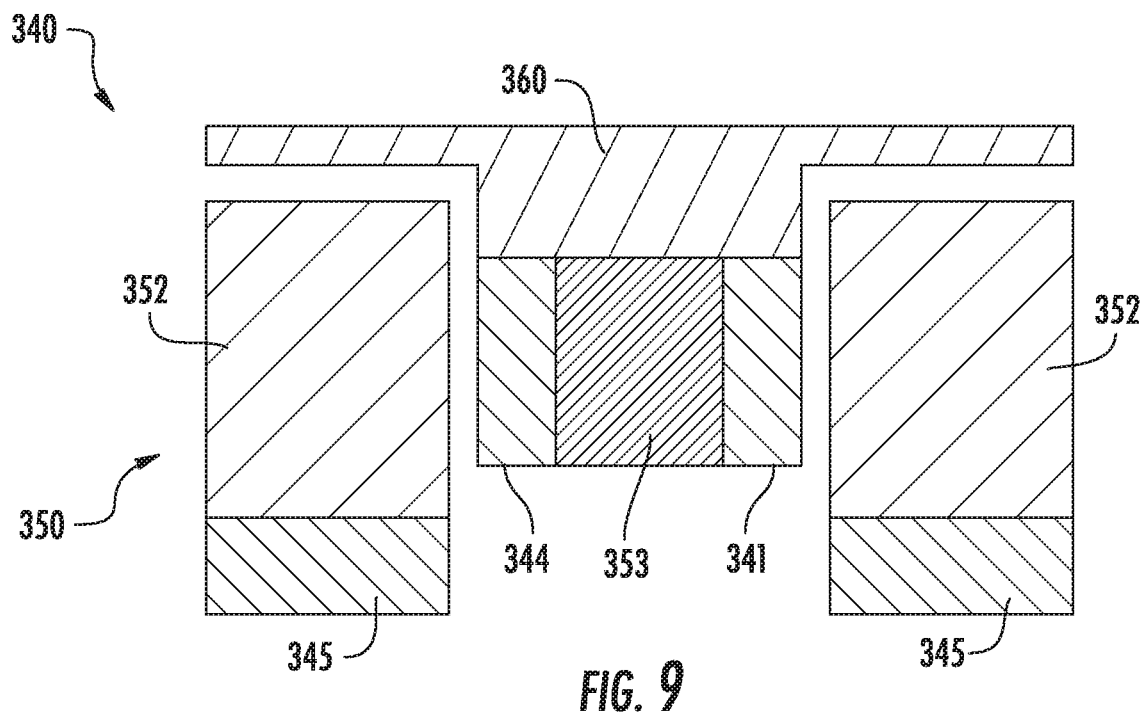
FIG. 9 is a schematic cross-sectional view of a haptic actuator in accordance with another embodiment.

Referring now to FIG. 9, in another embodiment, the haptic actuator 340 includes a base 345, for example, a rigid base. The base 345 may be stainless steel. The base 345 may be or include other and/or additional materials, for example, non-ferritic materials.

The haptic actuator 340 also includes a field member 350 coupled to the base 345 and that includes spaced apart permanent magnets 352 that define a slotted opening 344 therebetween. While two permanent magnets 352 are illustrated, there may be any number of permanent magnets.

The haptic actuator 340 also includes a coil 341. The coil 341 illustratively has a loop shape. The coil 341 may have another shape.

The haptic actuator 340 also includes a spring member 360 or cover spring, for example, that may include ferritic material. In some embodiments, the spring member 360 may include non-ferritic material. The spring member 360 suspends the coil 341 within the slotted opening 344 and permits relative movement of the field member and the coil 341. A body 353, which may include ferritic or non-ferritic material, may be in the opening defined by the loop shape of the coil 341.

Figure 10:
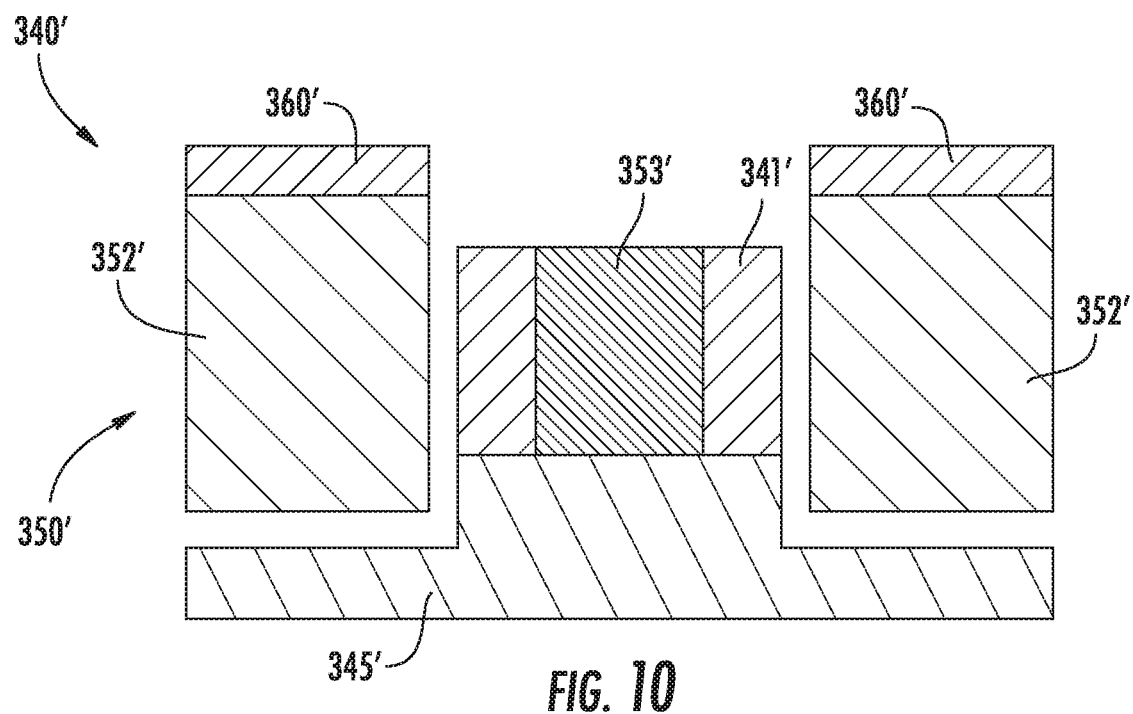
FIG. 10 is a schematic cross-sectional view of a haptic actuator in accordance with another embodiment.

Referring now to FIG. 10, in another embodiment, the haptic actuator 340' includes a base 345' and a coil 341' coupled to the base. The coil 341' illustratively has a loop shape. The coil 341' may have another shape.

The haptic actuator 340' also includes a field member 350' that includes spaced apart permanent magnets 352' that define a slotted opening 344' therebetween. While two permanent magnets 352' are illustrated, there may be any number of permanent magnets.

The haptic actuator 340' also includes a spring member 360'. The spring member 360' suspends the field member 350' within the slotted opening 344' and permits relative movement of the field member and the coil 341'. A body 353', which may include ferritic or non-ferritic material, may be in the opening defined by the loop shape of the coil 341'.

Figure 11:
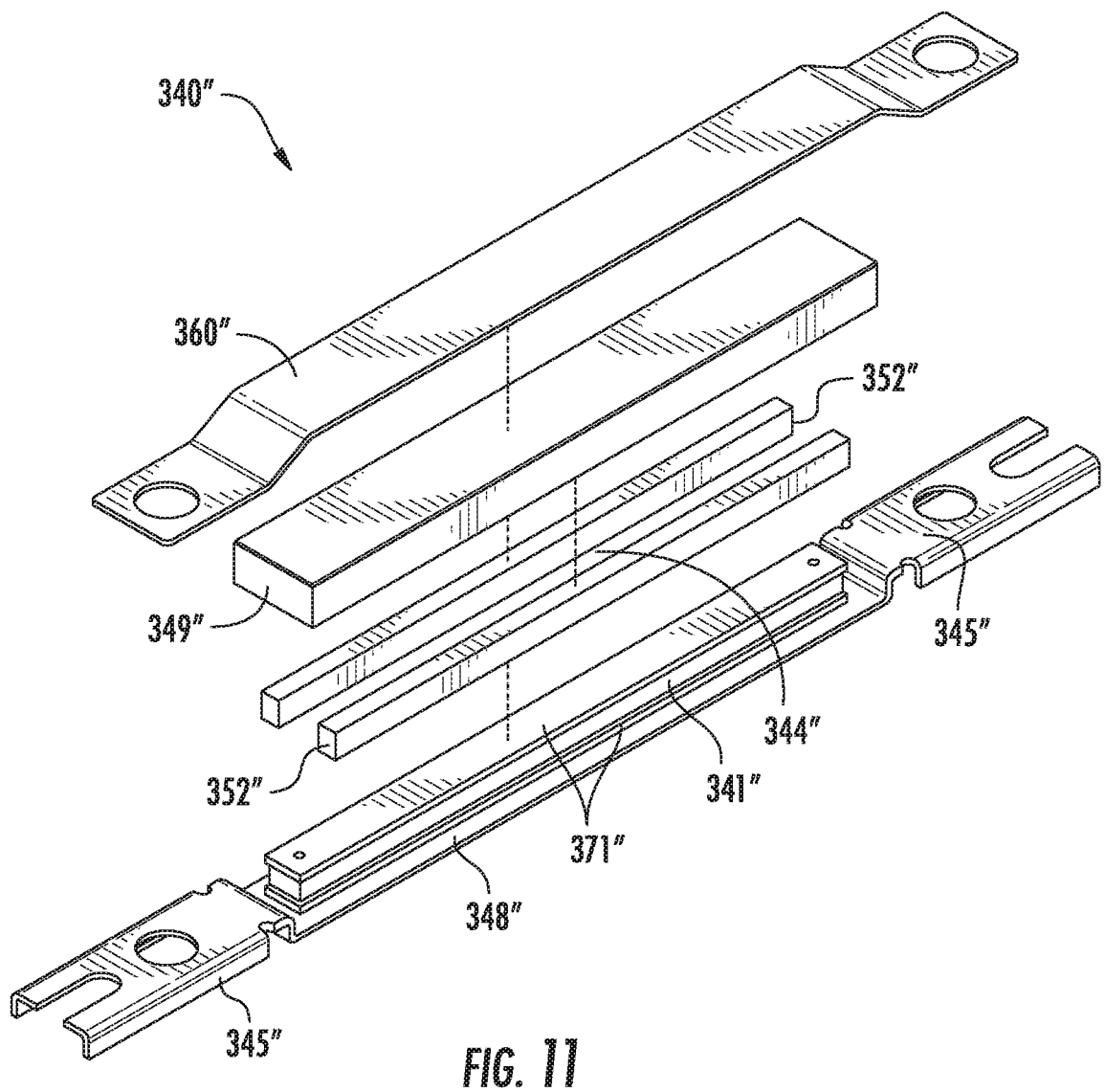
FIG. 11 is an exploded perspective view of a haptic actuator in accordance with another embodiment.

Referring now to FIG. 11, another embodiment of a haptic actuator 340" is illustrated. The base 345" illustratively includes a recessed area 348" within a medial portion of the base. The coil 341" is carried by the base 345" in the recessed area 348". The coil 341" includes a core 371", for example, stainless steel, which may be ferritic or non-ferritic, to enhance the magnetic field of the coil. The core 371" may include other materials, for example, ferritic or non-ferritic materials to enhance the magnetic field of the coil.

Permanent magnets 352" are positioned on opposite sides of the coil 341". The permanent magnets 352" are spaced apart to define a slotted opening 344" therebetween. A housing 349" or frame, which may include a ferritic material, may be coupled to the base 345" to cover or enclose the permanent magnets 352" and coil 341". A spring member 360" is carried by the housing 349". More particularly, the medial portion of the spring member 360" is carried by the housing 349" and opposing ends of the spring member are coupled to the base 345". The spring member 360" provides relative movement of the permanent magnets 352" and the coil 341". The materials of the illustrated elements may be similar to the materials described above with respect to other embodiments.

Figure 12:
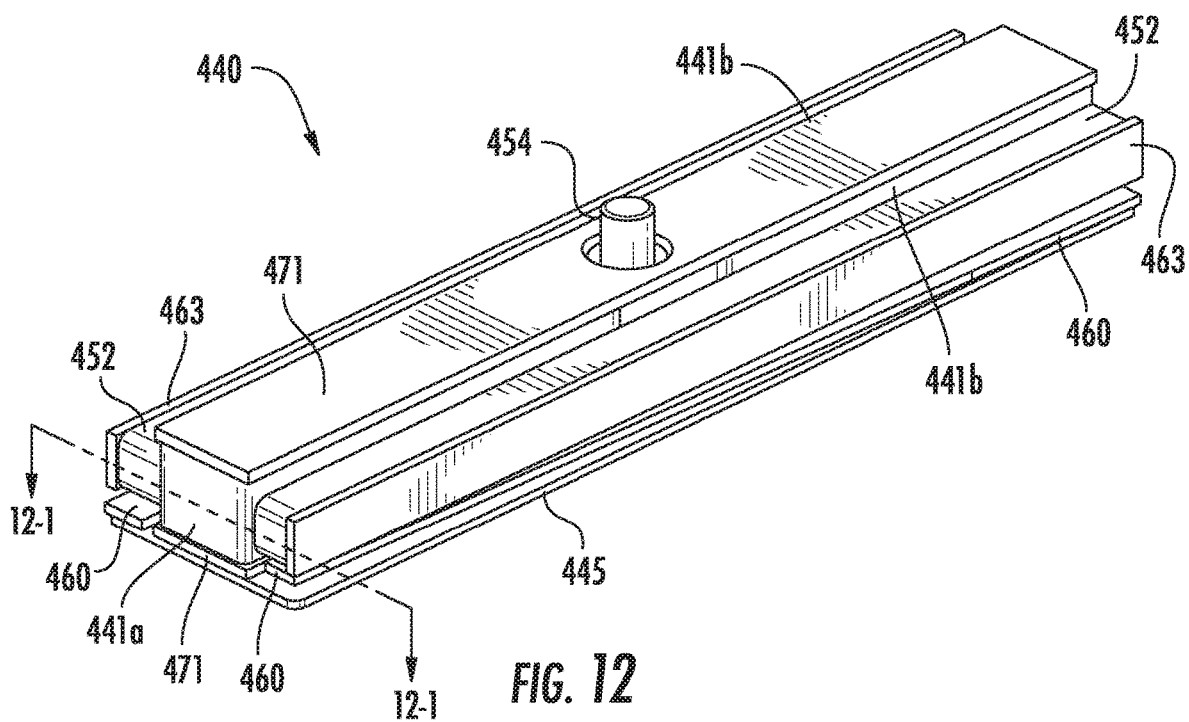
FIG. 12 is a perspective view of a haptic actuator in accordance with another embodiment.
Figure 13:
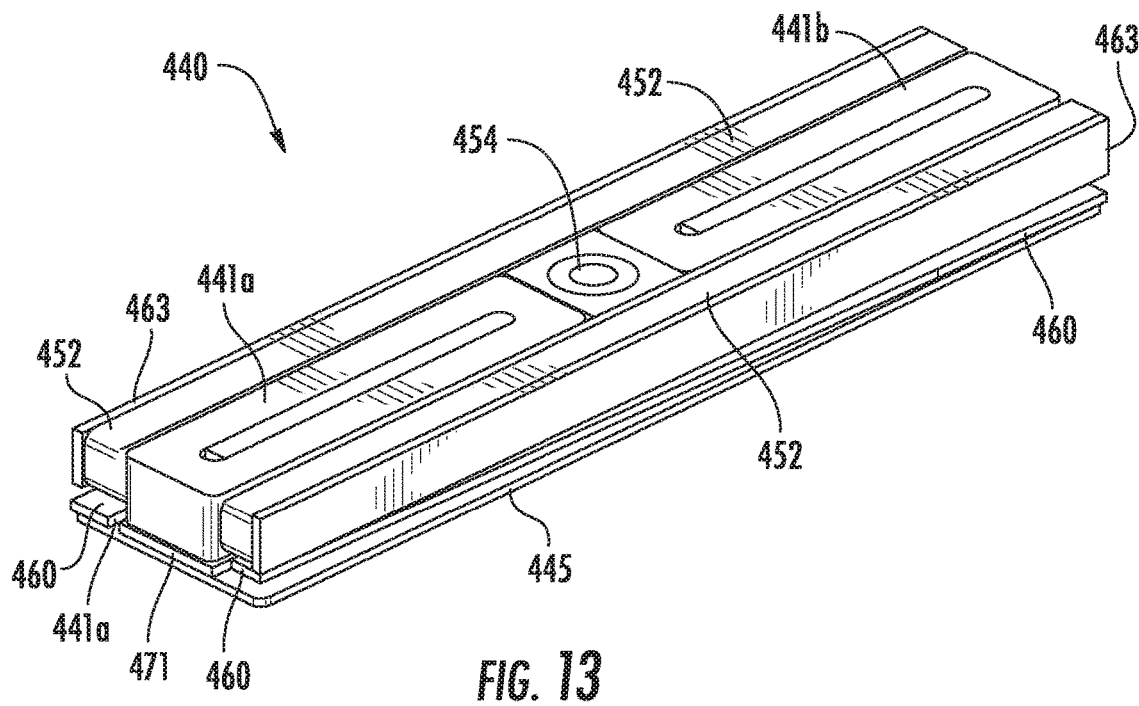
FIG. 13 is a schematic cross-sectional view of the haptic actuator of FIG. 12 taken along line 12-1.

Referring now to FIGS. 12 and 13, in another embodiment, the haptic actuator 440 may include first and second coils 441a, 441b. A core 471, for example, stainless steel, which may be ferritic or non-ferritic, is illustratively carried by the coils 441a, 441b on top and bottom sides to enhance the magnetic field of the coils. The core 471 may include other materials, for example, ferritic or non-ferritic materials to enhance the magnetic field of the coil.

A bearing 454, for example, a shaft bearing, is coupled to the base 445 between the first and second coils 441a, 441b. The bearing 454 may restrict motion in the x and y axis directions. A respective spring member 460, for example a leaf spring (e.g., stainless steel), is coupled between the base 445 and a permanent magnet 452 along longitudinal sides of the first and second coils 441a, 441b. More particularly, the permanent magnets 452 are spaced apart defining a slotted opening therebetween, and there is relative movement between the first and second coils 441a, 441b and the permanent magnets within the slotted opening. An optional concentrator 463 is longitudinally coupled to each permanent magnet 452.

Figure 14:
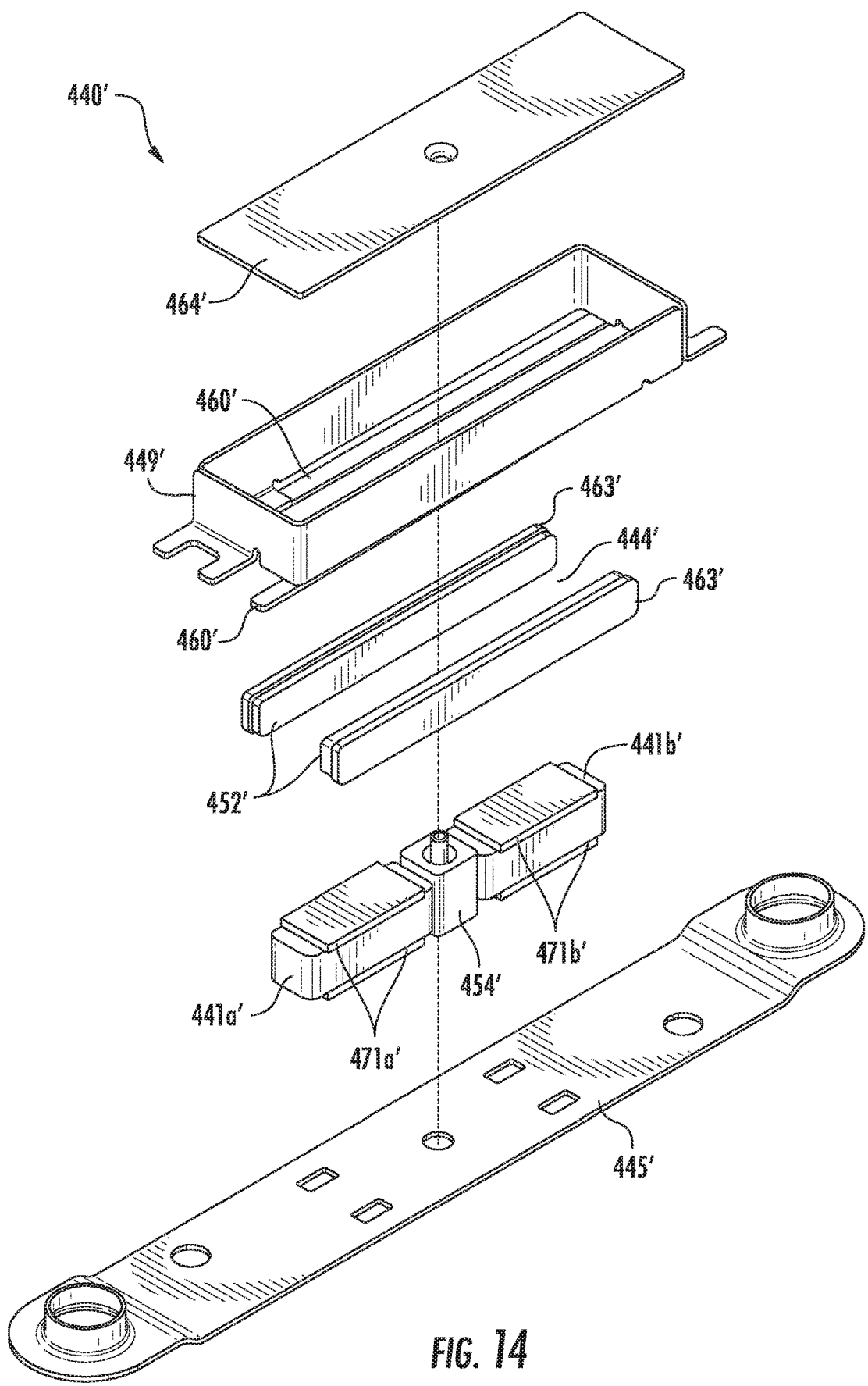
FIG. 14 is a partially exploded perspective view of a haptic actuator in accordance with another embodiment.

Referring now to FIG. 14, in another embodiment, the haptic actuator illustratively includes a frame 449' or housing that surrounds the first and second coils 441a', 441b', first and second cores 471a', 471b', the permanent magnets 452', and the optional concentrators 463'. The frame 449' may include ferritic material. A cover 464' is coupled to a top portion of the frame 449' to cover the first and second coils 441a', 441b', the permanent magnets 452', and the optional concentrators 463'. Elements illustrated but not specifically described are similar, including with respect to materials, to the embodiments described above.

Figure 15:
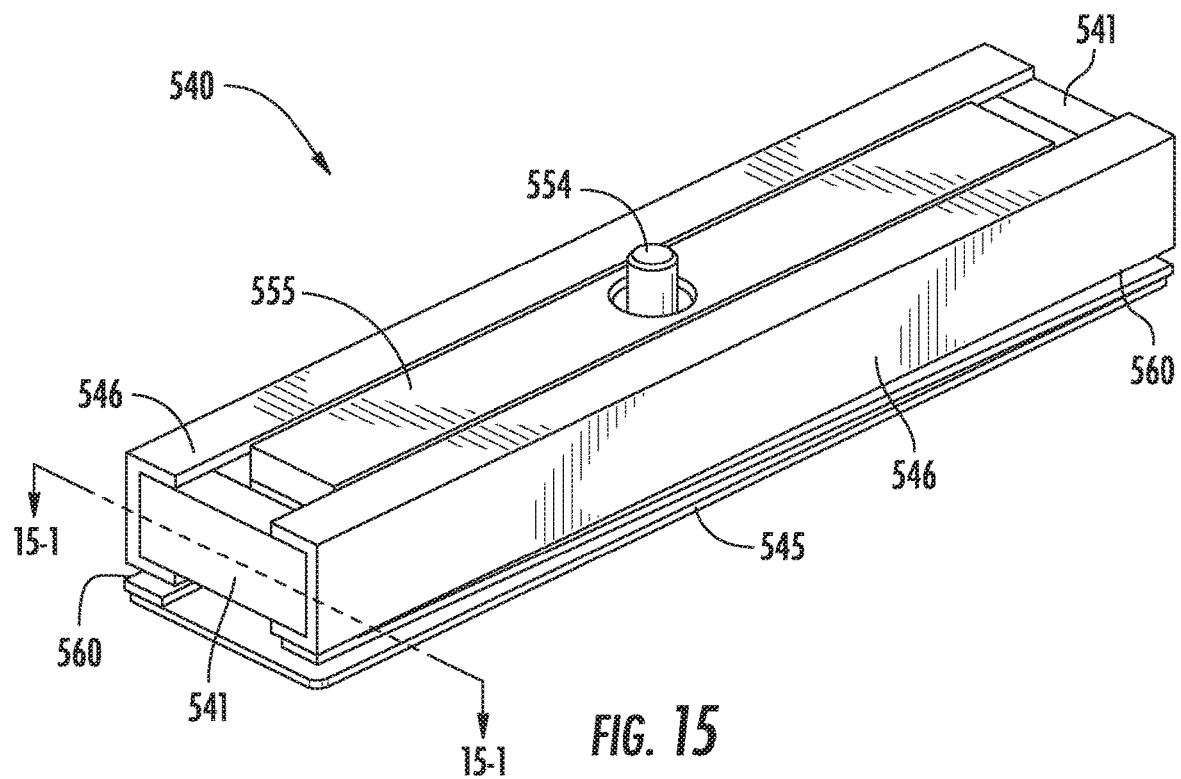
FIG. 15 is a perspective view of a haptic actuator in accordance with an embodiment.
Figure 16:
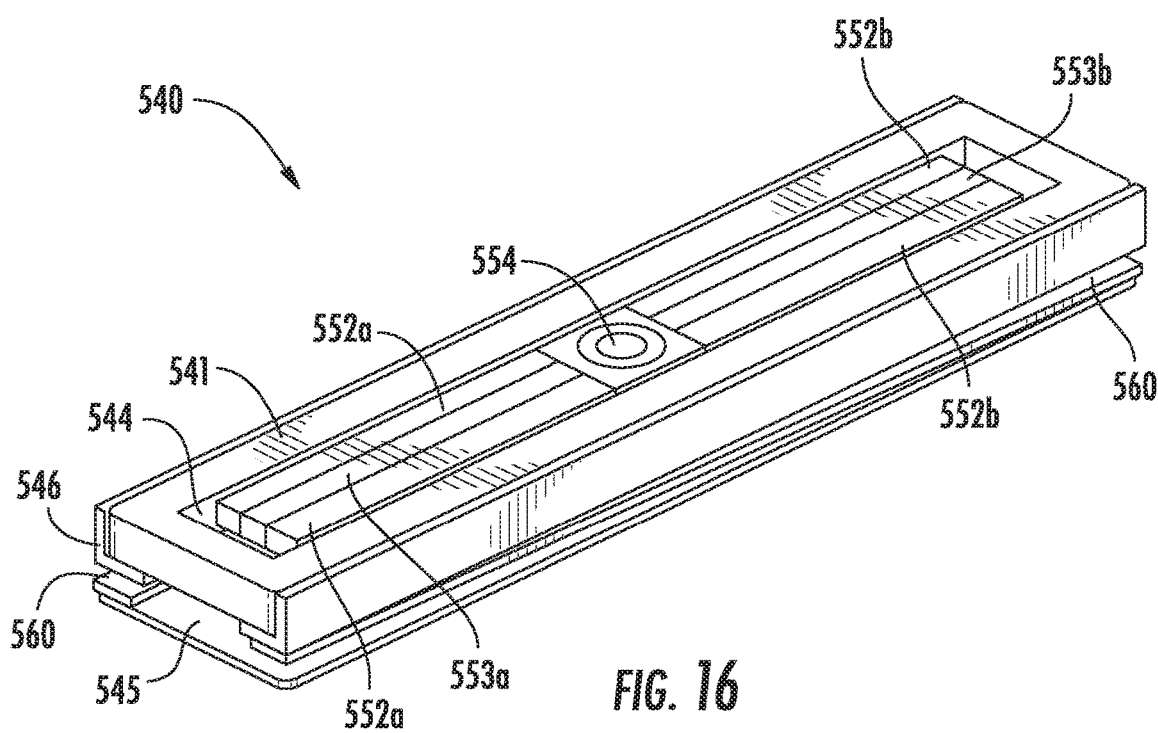
FIG. 16 is a schematic cross-sectional view of the haptic actuator of FIG. 15 taken along line 15-1.

Referring now to FIGS. 15 and 16, in another embodiment, the haptic actuator 540 may include first and second sets of spaced apart permanent magnets 552a, 552b including a respective ferritic body 553a, 553b between the spaced apart permanent magnets. A bearing 554, for example, a shaft bearing, is coupled to the base 545 between the first and second sets of permanent magnets 552a, 552b. A magnet spacer 555 is carried by the first and second sets of permanent magnets 552a, 552b and has an opening therein to receive the bearing 554 therethrough. A second magnet spacer may be coupled or carried by the first and second sets of the spaced apart permanent magnets 552a, 552b opposite the magnet spacer 555.

The coil 541 surrounds the first and second sets of spaced apart permanent magnets 552a, 552b and is carried by a coil tray 546. The coil has a loop shape defining a slotted opening 544 therein. A respective spring member 560, for example a leaf spring (e.g., stainless steel), is coupled between the base 545 and the coil tray 546 and provides relative movement between the coil 541 and first and second sets of permanent magnets 552a, 552b within the slotted opening 544.

Figure 17:
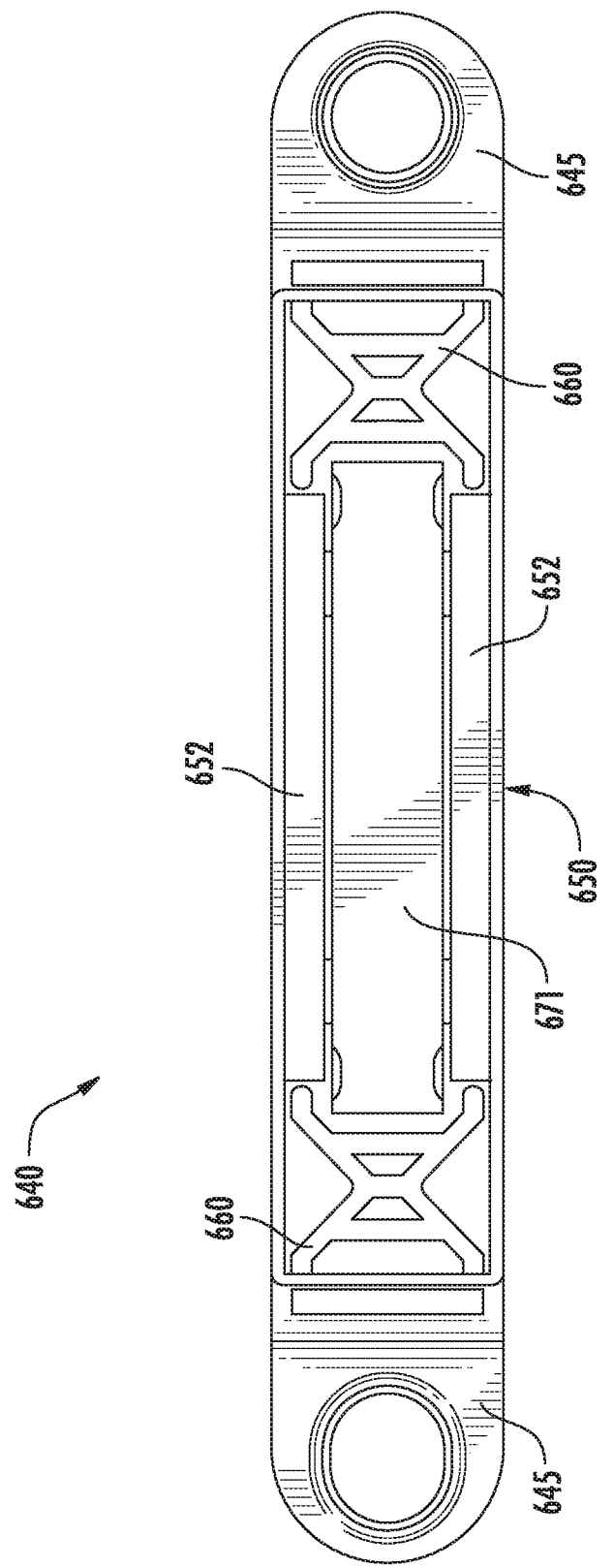
FIG. 17 is a schematic top view of a haptic actuator in accordance with another embodiment.

Referring now to FIG. 17, in another embodiment, the haptic actuator 640 may include flexures 660 coupled between opposing ends of the housing 649 and the adjacent ends of the field member 650. The flexures 660 may be used instead of or in addition to spring members, for example, leaf springs. While a specific configuration with respect to a coil 641, core 671, and permanent magnets 652 is illustrated, those skilled in the art will appreciate that the coil may surround the permanent magnets. Elements illustrated, but not specifically describe, including respective materials, are similar to the elements described above.

Figure 18:
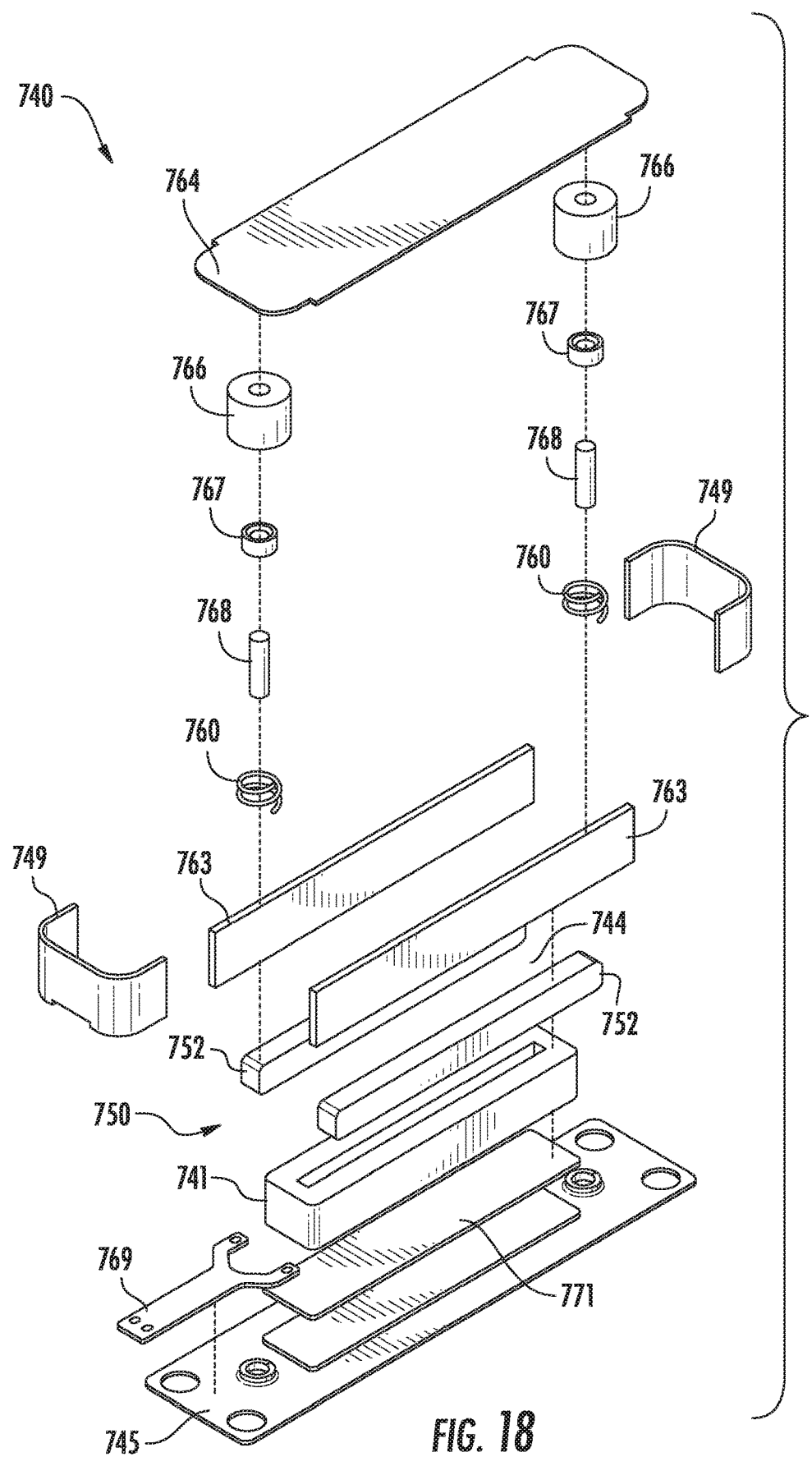
FIG. 18 is an exploded perspective view of a haptic actuator in accordance with another embodiment.
Figure 19:
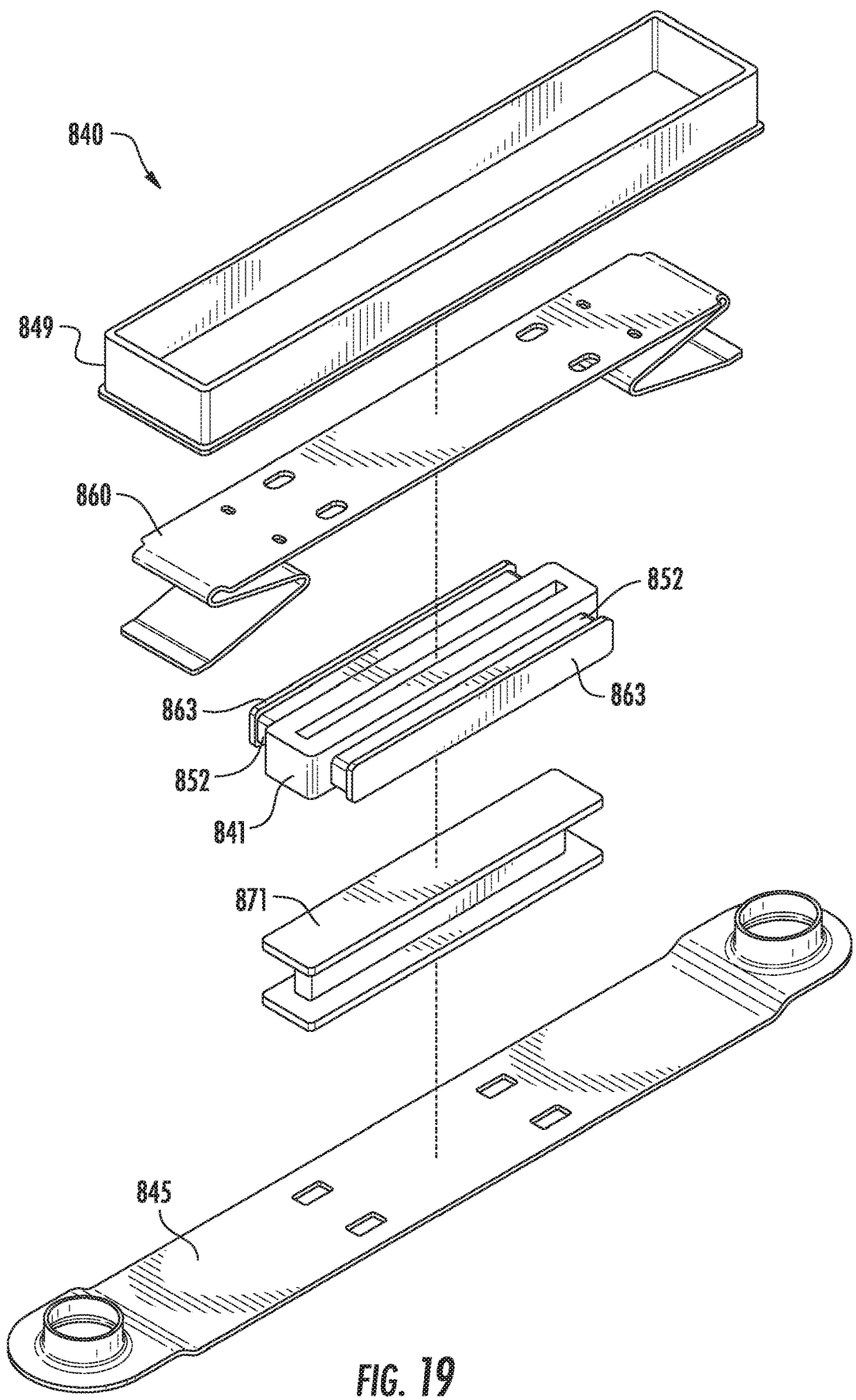
FIG. 19 is an exploded perspective view of a haptic actuator in accordance with another embodiment.

Referring now to FIG. 18, in another embodiment, the haptic actuator 740 includes a coil 741 and core 771 carried by the base 745. A circuit connector 769 is coupled to the coil 741. The field member 750 includes spaced apart permanent magnets 752 defining a slotted opening 744 therebetween. Respective concentrators 763, for example, including ferritic material, may be coupled adjacent the spaced apart permanent magnets 752. The concentrators 763 may define a portion of a frame 749 along with C-shaped frame ends, which include non-ferritic material. A cover 764 covers the spaced apart permanent magnets 752 or field member 750 and coil 741.

Spring members 760 in the form of coil springs are each coupled between the base 745 and the cover 764 by way of respective shafts 768, round bushings 767 and round bushing shafts 766. Elements illustrated, but not specifically described are similar to the elements described above.

Referring now to FIGS. 19-22, embodiments of a haptic actuator are illustrated. In particular, with respect to FIG. 19, the haptic actuator 840 includes a housing 849 or can that is coupled to the base 845 and covers or encloses a spring member 860 that is in the form of a z-spring. The spring member 860 is between the housing (interior) 849 and the loop shaped coil 841 within the slotted opening 844 between the spaced apart permanent magnets 852 (and including optional concentrators 863). The core 871, which enhances the magnetic field of the coil 841, extends through the through opening in the coil and also is carried by opposing top and bottom sides of the coil.

Figure 20:
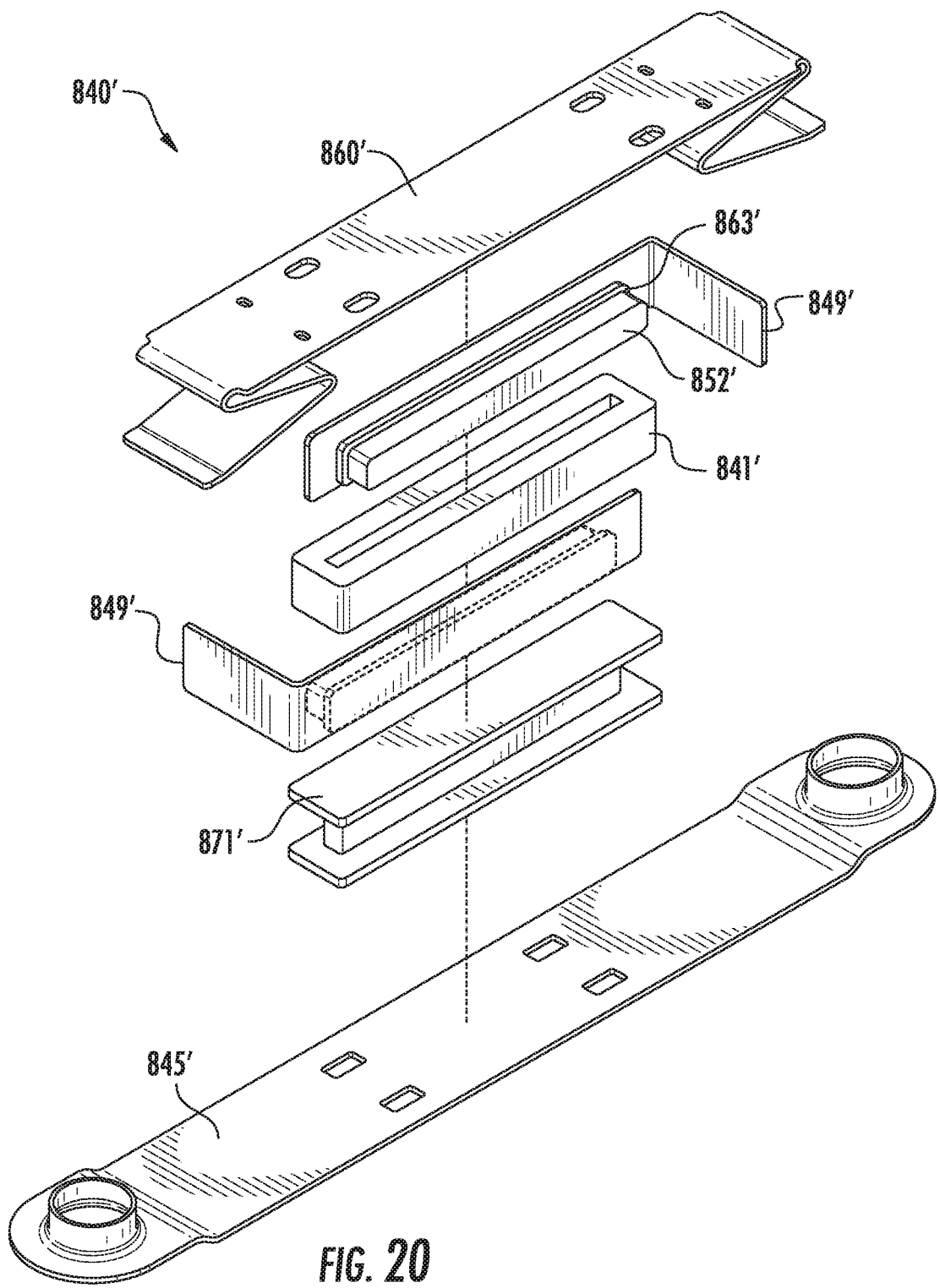
FIG. 20 is an exploded perspective view of a haptic actuator in accordance with another embodiment.

The haptic actuator 840' illustrated in FIG. 20 includes an inner frame 849' that includes a pair of L-shaped sidewalls. The spaced apart permanent magnets 852' are carried by the inner frame 849'. The inner frame 849' is carried between the legs of the spring member 860' or z-spring.

Figure 21:
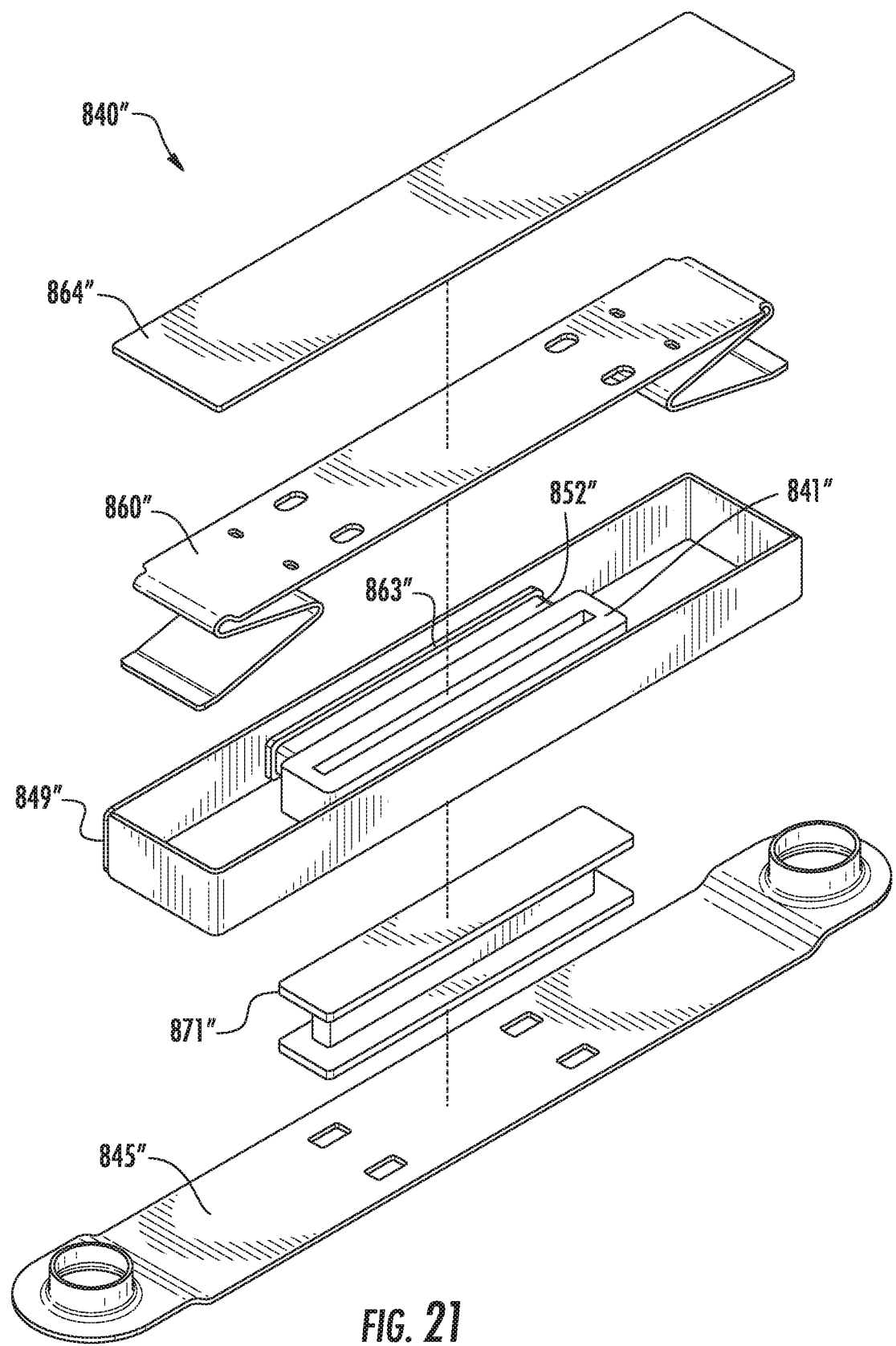
FIG. 21 is an exploded perspective view of a haptic actuator in accordance with another embodiment.
Figure 22:
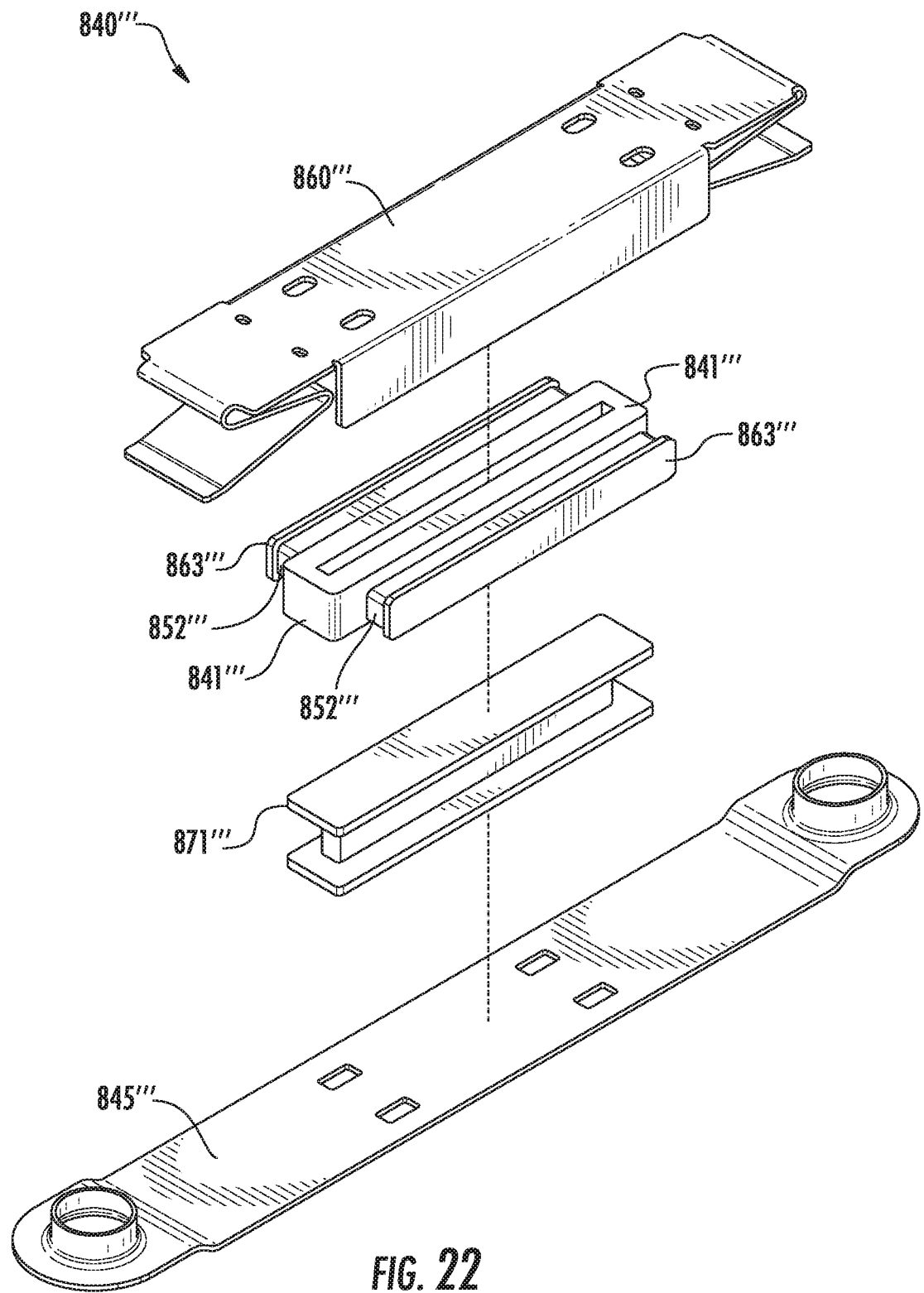
FIG. 22 is an exploded perspective view of a haptic actuator in accordance with another embodiment.

Referring to FIG. 21, the haptic actuator 840" includes an outer frame 849" that has a rectangular shape and surrounds or encloses the spring member 860", the loop shaped coil 841" and core 871" between the spaced apart permanent magnets 852". A cover 864" is coupled to the outer frame 849" to cover the spring member 860", and the loop shaped coil 841" between the spaced apart permanent magnets 852". Referring now to FIG. 22, the spring member 860''' or z-spring has downwardly extending sidewalls that extend from the spring member to the base 845''' to define a housing for the loop shaped coil 841''', core 871''' and spaced apart permanent magnets 852'''. Elements illustrated, but not specifically describe, including respective materials, are similar to the elements described above.

Figure 23:
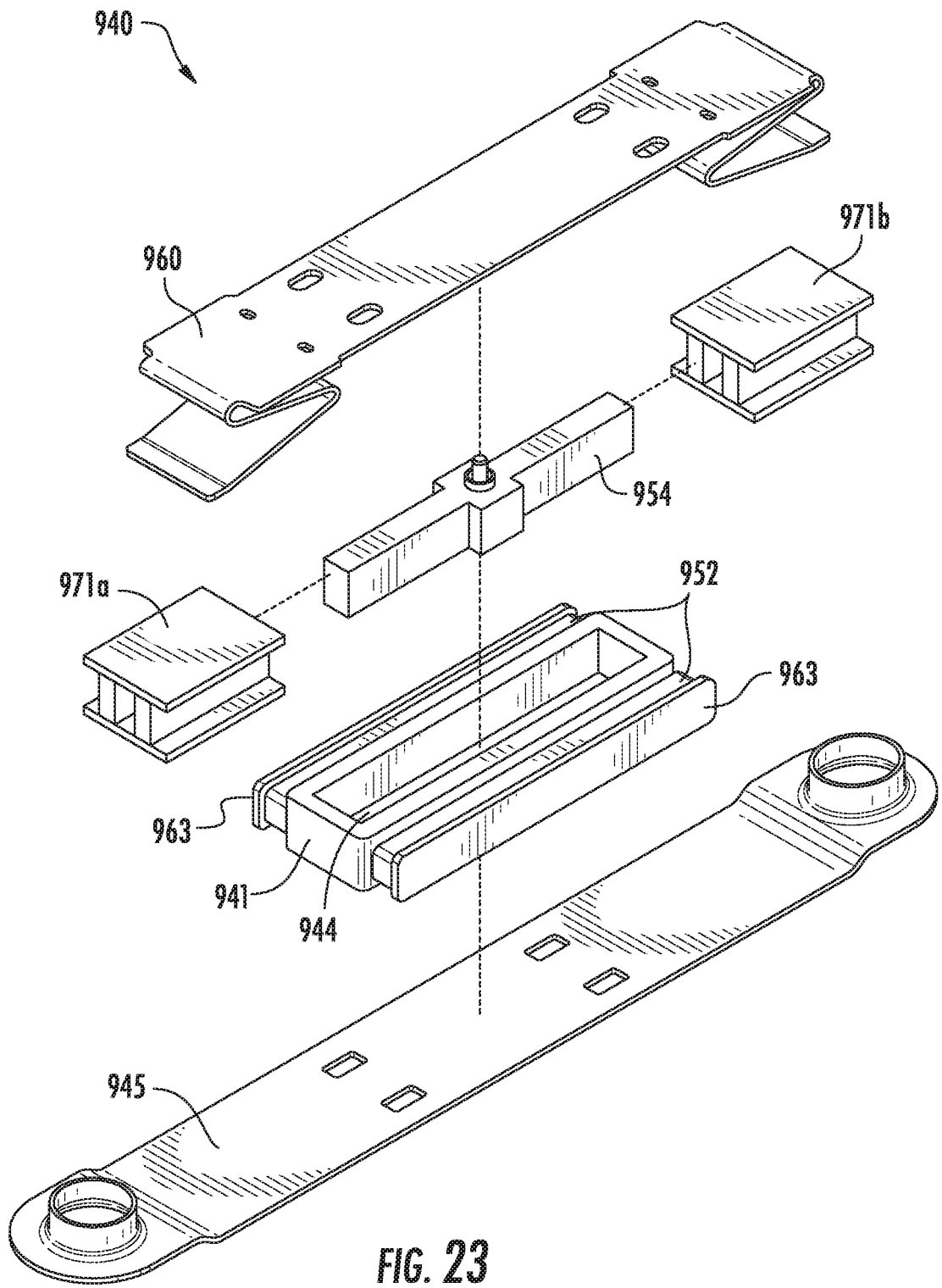
FIG. 23 is an exploded perspective view of a haptic actuator in accordance with another embodiment.

Referring now to FIG. 23, another embodiment of a haptic actuator 940 is illustrated that provides increased z-axis stabilization. The spring member 960 is illustratively in the form of a z-spring. A single coil 941 having a loop shape defining a slotted coil opening 944 is carried by the base 945. A shaft bearing 954 is carried within the slotted coil opening 944. First and second cores 971a, 971b surround legs of the shaft bearing 954 and also extend over opposing top and bottom sides of the coil 941.

Spaced apart permanent magnets 952, including the optional concentrators 963, are carried on opposite sides of the coil 941 so that the coil is carried in a slotted opening defined by the spaced apart permanent magnets.

Figure 24:
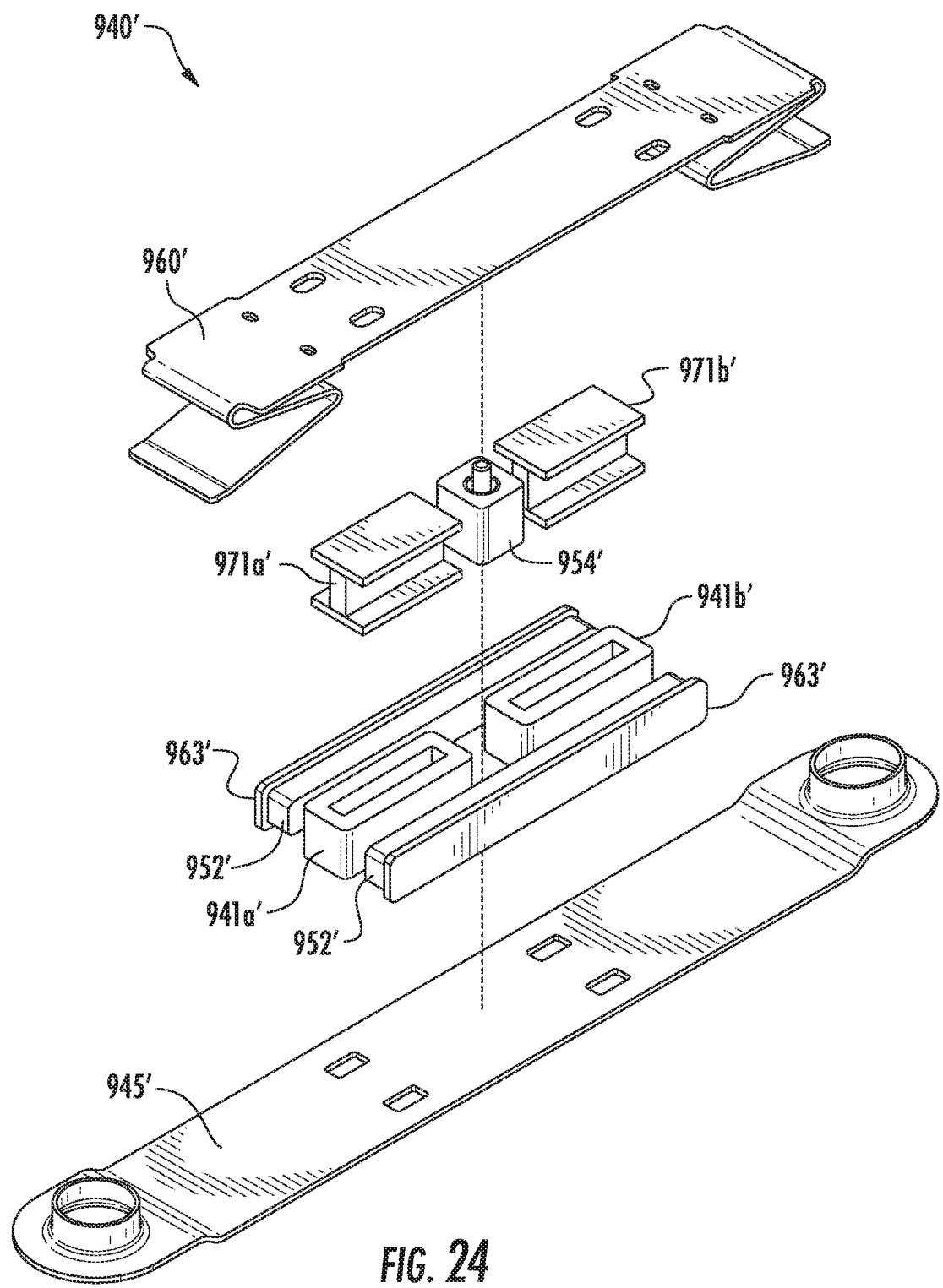
FIG. 24 is an exploded perspective view of a haptic actuator in accordance with another embodiment.
Figure 25:
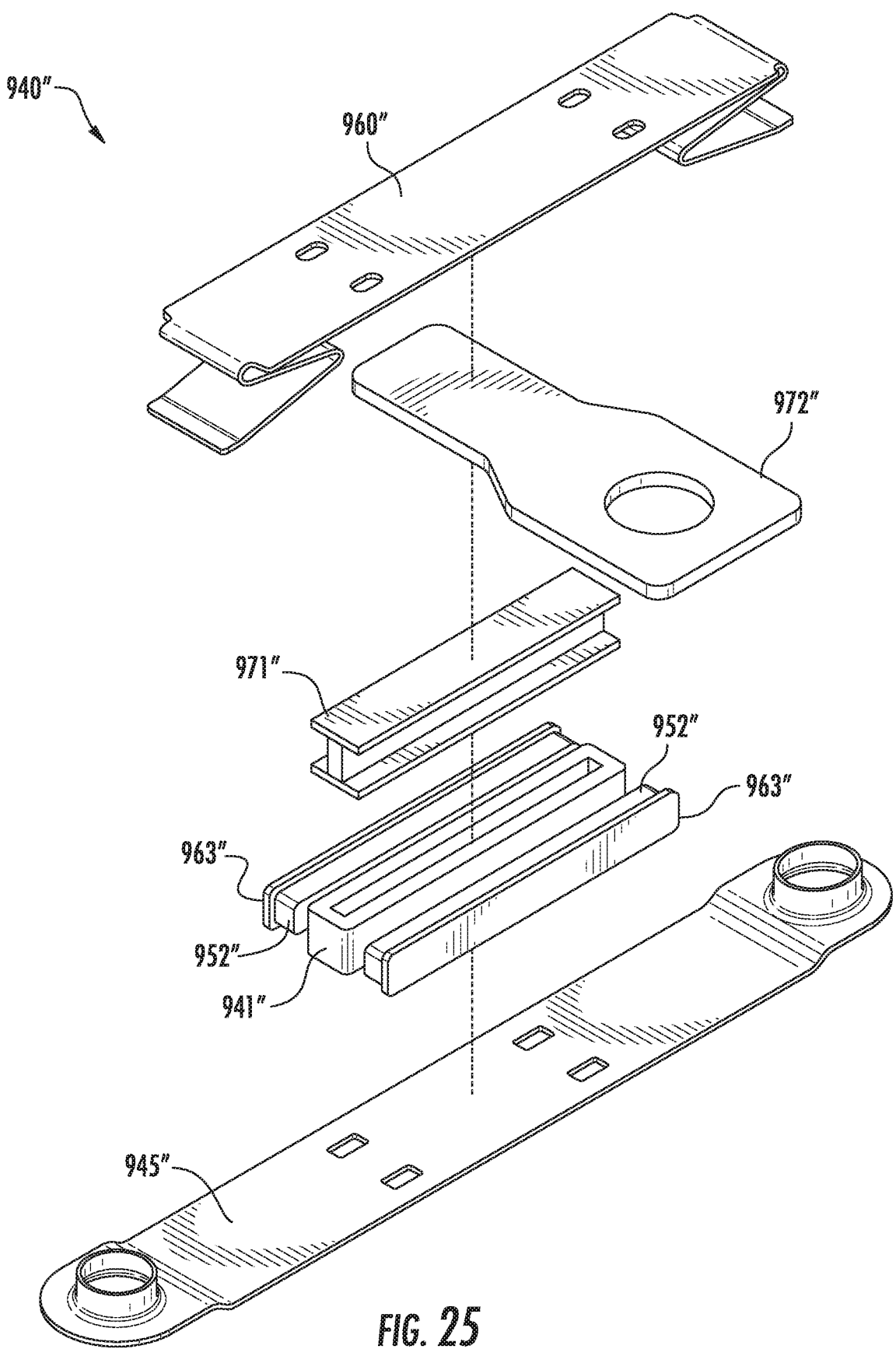
FIG. 25 is an exploded perspective view of a haptic actuator in accordance with another embodiment.

Referring now to FIG. 24, the haptic actuator 940' includes a shaft bearing 954' between two loop shaped coils 941a', 941b'. Referring now to FIG. 25, a sliding horizontal shim 972" is used in place of a shaft bearing for z-axis stabilization. Elements illustrated, but not specifically describe, including respective materials, are similar to the elements described above.

Figure 26:
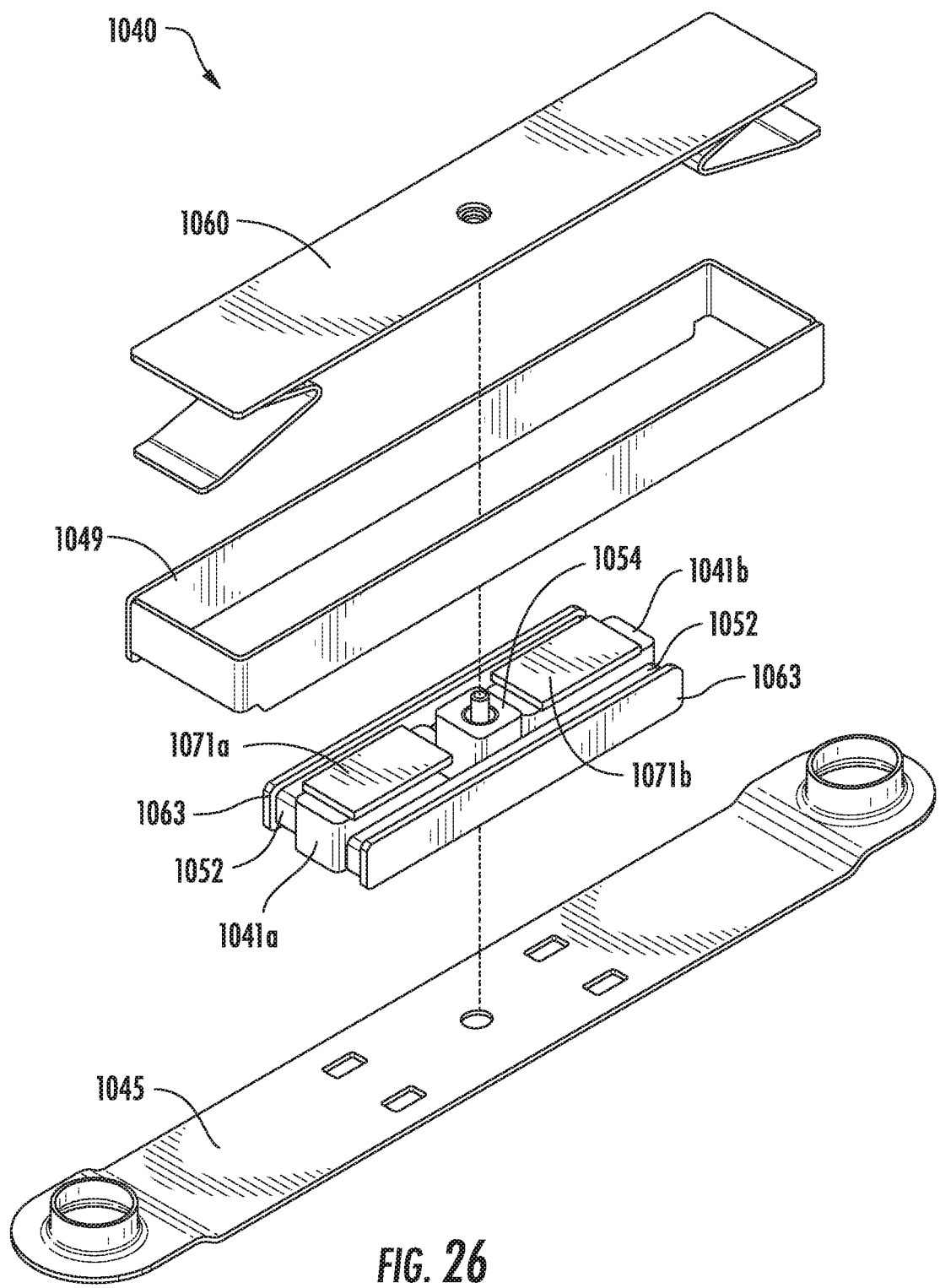
FIG. 26 is a partially exploded perspective view of a haptic actuator in accordance with another embodiment.

Referring now to FIG. 26, in another embodiment, the haptic actuator 1040 illustratively includes a spring member 1060 that is in the form of an asymmetric z-spring and a frame 1049. The asymmetric z-spring 1060 couples to the base 1045 and defines a cover over the bearing 1054, first and second coils 1041a, 1041b, first and second cores 1071a, 1071b, the spaced apart permanent magnets 1052, and the optional concentrators 1063.

Figure 27:
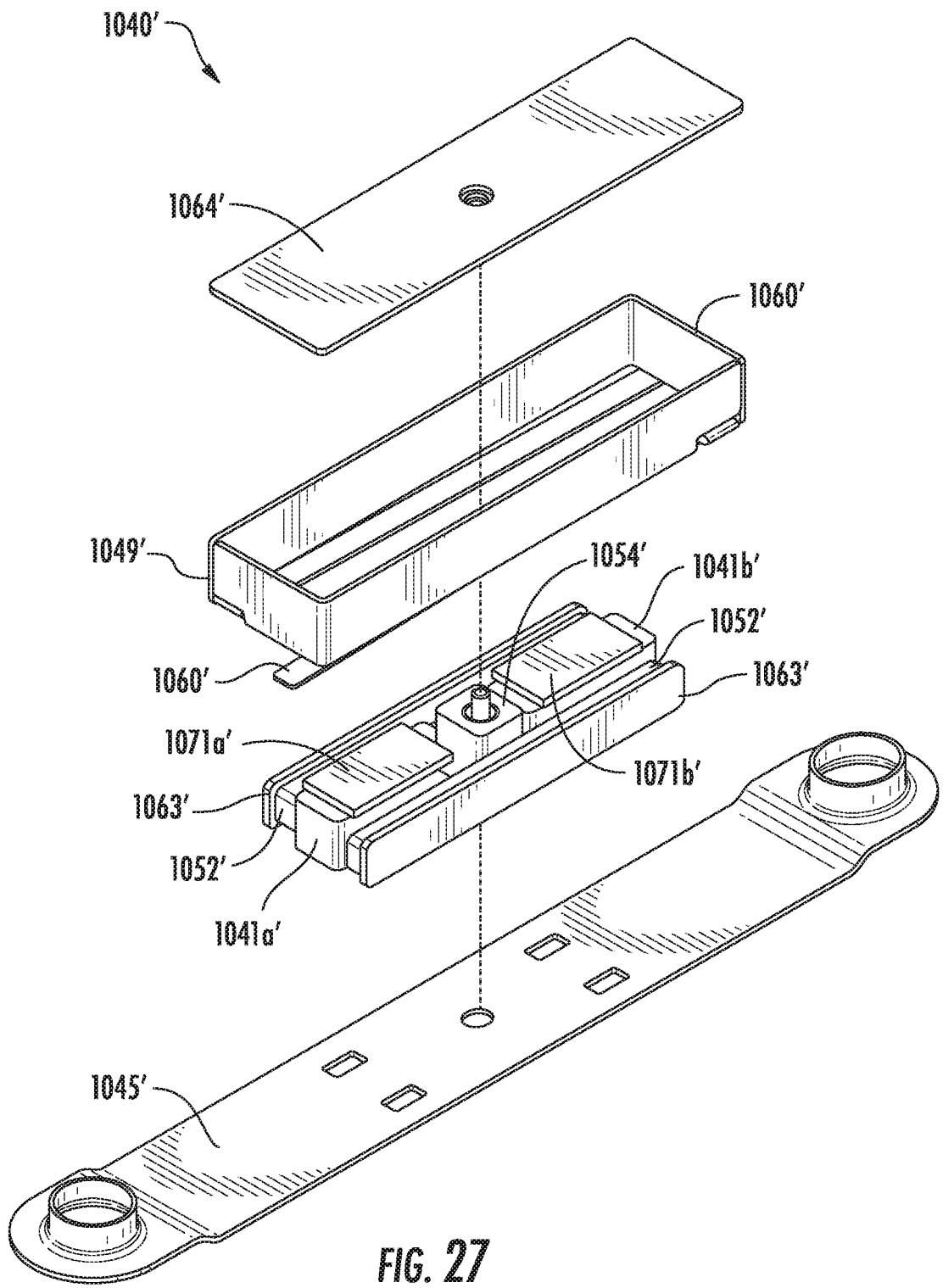
FIG. 27 is a partially exploded perspective view of a haptic actuator in accordance with another embodiment.
Figure 28:
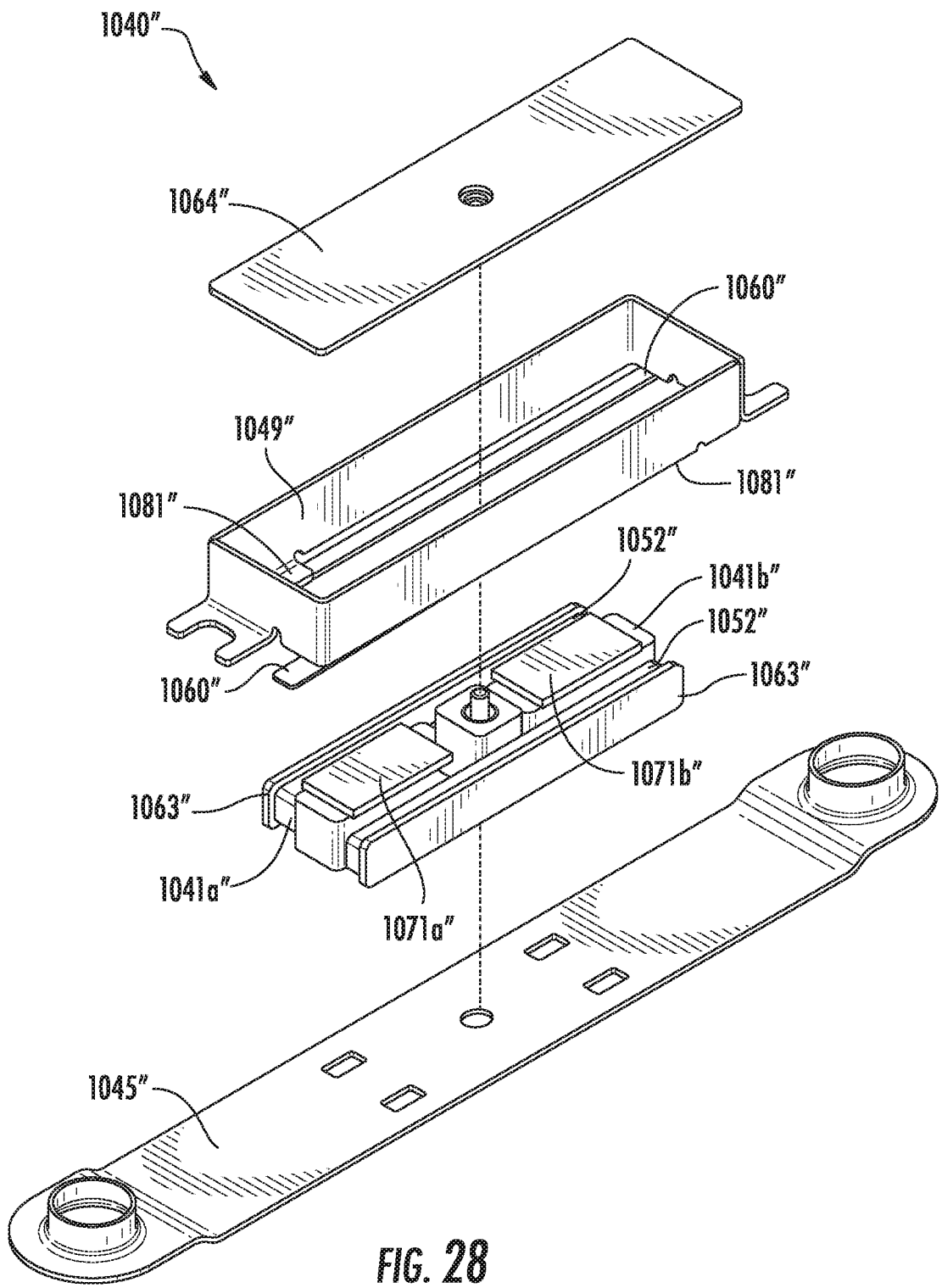
FIG. 28 is a partially exploded perspective view of a haptic actuator in accordance with another embodiment.

Referring now to FIG. 27, in another embodiment of a haptic actuator 1040', instead of an asymmetric z-spring, the spring member 1060' is in the form of leaf springs carried by the base 1045' between the base and the spaced apart permanent magnets 1052'. A cover 1064' is over the frame 1049' and covers the bearing 1054', first and second coils 1041a', 1041b', first and second cores 1071a', 1071b', the spaced apart permanent magnets 1052' and the optional concentrators 1063'. The embodiment of the haptic actuator 1040" in FIG. 28 adds a magnet shelf 1081". Elements illustrated, but not specifically describe, including respective materials, are similar to the elements described above.

A method aspect is directed to a method of making a haptic actuator 140. The method includes coupling a coil 141 to a base 145. The coil 141 may have a loop shape defining a slotted opening 144 therein. The method further includes positioning a spring member 160 to suspend a field member 150 that includes spaced apart permanent magnets 152 within the slotted opening 144 and permits relative movement of the field member and the coil 141.

Another method aspect is directed to a method of making a haptic actuator 140. The method includes coupling a field member 150 to a base 145. The field member 150 includes spaced apart permanent magnets 152. The method also includes positioning a spring member 160 to suspend a coil 141 having a loop shape defining a slotted opening 144 therein so that the field member 150 is within the slotted opening and permits relative movement of the field member and the coil.

Another method aspect is directed to a method of making a haptic actuator 140. The method includes coupling a coil 141 to a base 145 and positioning a spring member 160 to suspend a field member 150 that includes spaced apart permanent magnets 152 defining a slotted opening 144 therebetween so that the coil is within the slotted opening and permits relative movement of the field member and the coil.

Another method aspect is directed to a method of making a haptic actuator 140. The method includes coupling a field member 150 to a base 145. The field member 150 includes spaced apart permanent magnets 152 defining a slotted opening 144 therebetween. The method may also include positioning a spring member 160 to suspend a coil 141 within the slotted opening 144 and permitting relative movement of the field member 150 and the coil.

Indeed, for applications where a haptic actuator 140 is subjected to a variable load or displacement which causes coils and magnetic components to displace relative to each other, it may be desirable for the supporting structures and magnetic circuit components to be engineered to achieve desired force and motion targets. For constrained dimensions in length, width, and height of the haptic actuator 140, it may be desirable that the configuration of coils and magnets be designed such that the haptic actuator is capable of delivering force and motion targets through a range of loads or displacement conditions.

Accordingly, the embodiments of the haptic actuator 140 may be particularly advantageous for narrow-width applications and the arrangements or embodiments described herein may provide a magnetic return path, and a rigid base and compliant suspension. Moreover, the embodiments of the haptic actuator 140 described herein may provide a constant or linear force response in the direction of actuation. Relative component motion may also be reduced due to magnetic attraction force in x, y, and z axes, but allows for force and displacement transmission in desired axis (in the examples shown, the desired axis is the vertical (z) axis).

Still further, the magnetic circuit portion of the embodiments of the haptic actuator 140 may reduce, for example, minimize magnetic bias (closing) force in the actuation direction. In other words, the embodiments of the haptic actuator 140 advantageously may provide a reduced size haptic actuator for space-constrained applications while allowing linear/constant force and motion transmission through wide operational range in axis of motion.

The embodiments of haptic actuator described herein may advantageously be used with a trackpad for providing haptic feedback based upon user input or pressures. For example, the haptic actuators described herein may provide click-feedback to a user based upon downward pressure or a "clicking" motion input to the trackpad. More than one haptic actuator may be used in any given trackpad. For example, multiple haptic actuators as described herein may be positioned in side-by-side relation over a length of a trackpad. Of course, the haptic actuators described herein may be used to provide haptic feedback in other implementations other than a trackpad.

While embodiments of haptic actuators have been described herein, it should be understood that any one or more elements from any given embodiment may be used with elements from any other embodiment or embodiments. Moreover, while certain materials have also been described herein with respect to certain embodiments, it should be understood that materials described with respect to any particular embodiment may be used in addition to, instead of, and/or in conjunction with other material described with respect to any other embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A haptic actuator comprising:
   a base;
   a field member coupled to the base and comprising a plurality of spaced apart permanent magnets including a first permanent magnet and a second permanent magnet;
   a coil having a loop shape defining a slotted opening therein; and
   a spring member suspending the coil so that the field member is within the slotted opening and permitting relative movement of the field member and the coil; the first permanent magnet at least partially disposed within the slotted opening, and the second permanent magnet disposed at least partially between the first permanent magnet and the coil.

2. The haptic actuator of claim 1 wherein the plurality of spaced apart permanent magnets comprises first and second sets of permanent magnets; and further comprising a bearing coupled to the base between the first and second sets of permanent magnets.

3. The haptic actuator of claim 1 further comprising a magnet spacer coupled between the field member and the base.

4. The haptic actuator of claim 1 wherein the spring member has a spring member opening therein sized to permit passage of the field member therethrough.

5. The haptic actuator of claim 1 wherein the field member comprises a ferritic body disposed between permanent magnets of the plurality of spaced apart permanent magnets.

6. The haptic actuator of claim 5 wherein the ferritic body comprises stainless steel.

7. The haptic actuator of claim 1 wherein the base comprises stainless steel.

8. The haptic actuator of claim 1 further comprising a coil tray carrying the coil and coupled to the base.

9. The haptic actuator of claim 1 wherein the spring member comprises a ferritic material.

10. The haptic actuator of claim 1 further comprising at least one spacer carried by the spring member opposite the field member.

11. The haptic actuator of claim 1 further comprising a plurality of mechanical stops adjacent opposing ends of the field member.

12. An electronic device comprising:
a housing;
wireless communications circuitry carried by the housing;
a haptic actuator carried by the housing and comprising
 a base,
 a field member coupled to the base and comprising a plurality of spaced apart permanent magnets,
 at least one coil having a loop shape defining a slotted opening therein, and
 a spring member suspending the at least one coil so that the field member is within the slotted opening and permitting relative movement of the field member and the at least one coil; the permanent magnets of the plurality of spaced apart permanent magnets spaced apart from each other, and spaced apart from the at least one coil, along a same direction; and
a controller coupled to the wireless communications circuitry and the haptic actuator and configured to perform at least one wireless communications function and selectively operate the haptic actuator.

13. The electronic device of claim 12 wherein the plurality of spaced apart permanent magnets comprises first and second sets of permanent magnets; and wherein the haptic actuator further comprises a bearing coupled to the base between the first and second sets of permanent magnets.

14. The electronic device of claim 12 wherein the haptic actuator further comprises a magnet spacer coupled between the field member and the base.

15. The electronic device of claim 12 wherein the spring member has a spring member opening therein sized to permit passage of the field member therethrough.

16. The electronic device of claim 12 wherein the field member comprises a ferritic body disposed between permanent magnets of the plurality of spaced apart permanent magnets.

17. The electronic device of claim 12 wherein the spring member comprises a ferritic material.

18. A method of making a haptic actuator comprising:
coupling a field member to a base, the field member comprising a plurality of spaced apart permanent magnets including a first permanent magnet and a second permanent magnet;
positioning a spring member to suspend a coil having a loop shape defining a slotted opening therein so that the field member is within the slotted opening and permits relative movement of the field member and the coil, and so that the first permanent magnet is at least partially disposed within the slotted opening, and the second permanent magnet is disposed at least partially between the first permanent magnet and the coil.

19. The method of claim 18 wherein the plurality of spaced apart permanent magnets comprises first and second sets of permanent magnets; and further comprising coupling a bearing to the base between the first and second sets of permanent magnets.

20. The method of claim 18 further comprising coupling a magnet spacer between the field member and the base.

21. The method of claim 18 wherein the spring member has a spring member opening therein sized to permit passage of the field member therethrough.

22. The method of claim 18 wherein the field member comprises a ferritic body disposed between permanent magnets of the plurality of spaced apart permanent magnets.

* * * * *